(12) United States Patent
Ng et al.

(10) Patent No.: US 10,875,761 B2
(45) Date of Patent: Dec. 29, 2020

(54) SYSTEMS AND METHODS FOR A MEMS ACTUATION SYSTEMS DEVICE WITH ONE OR MORE SLIDABLE CONNECTION ASSEMBLIES

(71) Applicant: MEMS Drive, Inc., Pasadena, CA (US)

(72) Inventors: Matthew Ng, Rosemead, CA (US); Xiaolei Liu, South Pasadena, CA (US); Guiqin Wang, Arcadia, CA (US)

(73) Assignee: MEMS Drive, Inc., Pasadena, CA (US)

( * ) Notice: Subject to any disclaimer, the term of this patent is extended or adjusted under 35 U.S.C. 154(b) by 423 days.

(21) Appl. No.: 15/699,201

(22) Filed: Sep. 8, 2017

(65) Prior Publication Data

US 2018/0076739 A1 Mar. 15, 2018

Related U.S. Application Data

(60) Provisional application No. 62/393,436, filed on Sep. 12, 2016, provisional application No. 62/393,419, (Continued)

(51) Int. Cl.
*H02N 1/00* (2006.01)
*B81B 3/00* (2006.01)
*H04N 5/225* (2006.01)

(52) U.S. Cl.
CPC ......... *B81B 3/0021* (2013.01); *H04N 5/2254* (2013.01); *B81B 2203/0118* (2013.01)

(58) Field of Classification Search
CPC ... B81B 3/0021; B81B 3/0035; B81B 3/0037; B81B 3/0051; B81B 3/0062; B81B 3/0072; B81B 7/0016; B81B 2201/03; B81B 2201/033; B81B 2203/0118; B81B 2203/0136; B81B 2203/0145; B81B 2203/051; B81B 2203/053; B81B 2207/03; B81C 1/00301; B81C 2201/019; H02N 1/008; H02N 1/06; H02N 2/02; H02N 2/028; H04N 5/2253; H04N 5/2254; H01L 41/0536; H01L 41/0953; H01L 41/25; G02B 7/10; G02B 27/646
(Continued)

(56) References Cited

U.S. PATENT DOCUMENTS 6,556,741 B1 4/2003 Fan
6,964,231 B1 11/2005 Robinson et al.
(Continued)

OTHER PUBLICATIONS

International Search Report issued in related Application Serial No. PCT/US2017/050680 dated Nov. 13, 2017.
(Continued)

*Primary Examiner* — Shawki S Ismail
*Assistant Examiner* — Monica Mata
(74) *Attorney, Agent, or Firm* — Brian J. Colandreo; Michael T. Abramson; Holland & Knight LLP

(57) ABSTRACT

A micro-electrical-mechanical system (MEMS) device includes one or more slidable connection assemblies for releasably coupling the micro-electrical-mechanical system (MEMS) device to a wafer from which the micro-electrical-mechanical system (MEMS) device was made. The MEMS device may include a MEMS actuation core, and a MEMS electrical connector assembly electrically coupled to the MEMS actuation core configured to be electrically coupled to a printed circuit board.

18 Claims, 25 Drawing Sheets

Related U.S. Application Data filed on Sep. 12, 2016, provisional application No. 62/419,117, filed on Nov. 8, 2016, provisional application No. 62/419,814, filed on Nov. 9, 2016, provisional application No. 62/420,960, filed on Nov. 11, 2016.

(58) Field of Classification Search
USPC .......................................................... 310/300
See application file for complete search history.

(56) References Cited

U.S. PATENT DOCUMENTS

| | | | |
|---|---|---|---|
| 7,089,787 | B2 | 8/2006 | Sahin et al. |
| 7,554,421 | B2 | 6/2009 | Chou |
| 7,692,521 | B1 | 4/2010 | Cohn |
| 8,243,375 | B2 | 8/2012 | Woodard et al. |
| 8,319,393 | B2 | 11/2012 | DeReus |
| 8,451,078 | B2 | 5/2013 | Lai et al. |
| 8,637,961 | B2 | 1/2014 | Gutierrez et al. |
| 9,036,230 | B1 | 5/2015 | Lin |
| 9,258,587 | B2 | 2/2016 | Reddy et al. |
| 10,523,135 | B2 | 12/2019 | Ng et al. |
| 2002/0089044 | A1 | 7/2002 | Simmons et al. |
| 2002/0104990 | A1 | 8/2002 | DeReus et al. |
| 2007/0228869 | A1 | 10/2007 | Aksyuk et al. |
| 2008/0052723 | A1 | 2/2008 | Khanna |
| 2010/0066393 | A1 | 3/2010 | Bottoms et al. |
| 2010/0212528 | A1 | 8/2010 | Greywall |
| 2011/0315529 | A1 | 12/2011 | Segueni et al. |
| 2012/0017693 | A1 | 1/2012 | Robert et al. |
| 2012/0032286 | A1* | 2/2012 | Trusov ................. G01C 21/16 257/417 |
| 2013/0057757 | A1 | 3/2013 | Ryou |
| 2013/0279030 | A1 | 10/2013 | Calvet et al. |
| 2013/0329106 | A1 | 12/2013 | Bigioi et al. |
| 2014/0029120 | A1 | 1/2014 | Kim |
| 2014/0292137 | A1 | 10/2014 | Le Moai et al. |
| 2015/0350500 | A1 | 12/2015 | Gutierrez et al. |
| 2018/0072565 | A1 | 3/2018 | Ng et al. |

OTHER PUBLICATIONS

International Search Report issued in related Application Serial No. PCT/US2017/050662 dated Dec. 20, 2017.
International Search Report issued in related Application Serial No. PCT/US2017/050669 dated Nov. 8, 2017.
International Search Report issued in related Application Serial No. PCT/US2017/050708 dated Nov. 13, 2017.
Non-Final Office Action issued in U.S. Appl. No. 15/699,007 dated Apr. 4, 2019.
Non-Final Office Action issued in related U.S. Appl. No. 15/698,942 dated Jan. 29, 2020.
Notice of Allowance issued in related U.S. Appl. No. 15/699,007 dated Aug. 22, 2019.
Non-Final Office Action issued in related U.S. Appl. No. 15/699,137 dated Mar. 6, 2020.
Non-Final Office Action issued in related U.S. Appl. No. 15/699,306 dated Apr. 7, 2020.
Non-Final Office Action issued in related U.S. Appl. No. 15/698,917 dated Apr. 6, 2020.
Non-Final Office Action issued in related U.S. Appl. No. 15/698,989 dated Mar. 20, 2020.
Notice of Allowance issued in related U.S. Appl. No. 15/698,942 dated Jun. 15, 2020.

* cited by examiner

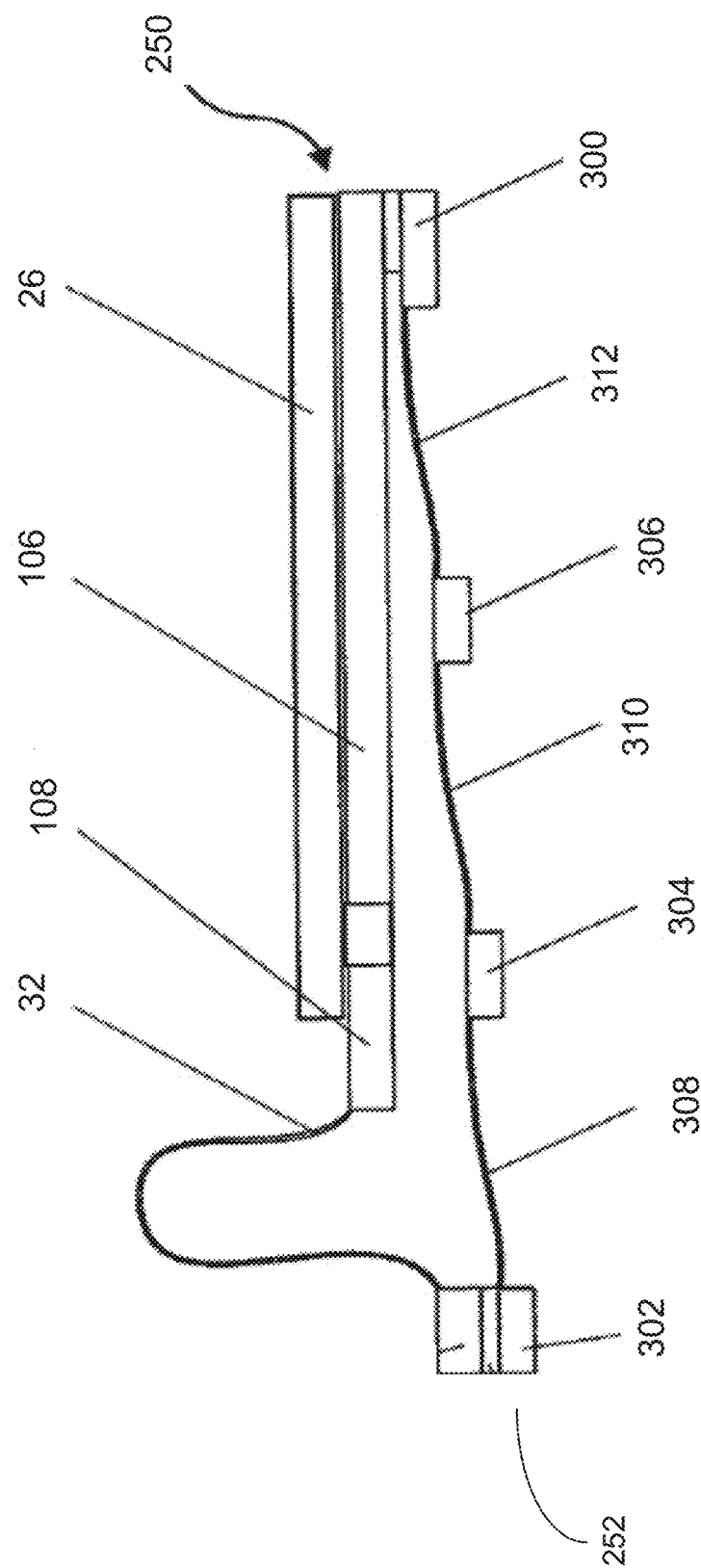

SYSTEMS AND METHODS FOR A MEMS ACTUATION SYSTEMS DEVICE WITH ONE OR MORE SLIDABLE CONNECTION ASSEMBLIES

RELATED CASE(S)

This application claims the benefit of the following U.S. Provisional Application Nos. 62/393,436 filed on 12 Sep. 2016, 62/393,419 filed on 12 Sep. 2016, 62/419,117 filed on 8 Nov. 2016, 62/419,814 filed on 9 Nov. 2016, and 62/420,960 filed on 11 Nov. 2016; their contents of which are incorporated herein by reference.

TECHNICAL FIELD

This disclosure relates to actuators in general and, more particularly, to miniaturized MEMS actuators configured for use within camera packages.

BACKGROUND

As is known in the art, actuators may be used to convert electronic signals into mechanical motion. In many applications such as e.g., portable devices, imaging-related devices, telecommunications components, and medical instruments, it may be beneficial for miniature actuators to fit within the small size, low power, and cost constraints of these application.

Micro-electrical-mechanical system (MEMS) technology is the technology that in its most general form may be defined as miniaturized mechanical and electro-mechanical elements that are made using the techniques of microfabrication. The critical dimensions of MEMS devices may vary from well below one micron to several millimeters. In general, MEMS actuators are more compact than conventional actuators, and they consume less power.

SUMMARY OF DISCLOSURE

Invention #7

In one implementation, a micro-electrical-mechanical system (MEMS) device includes one or more slidable connection assemblies for releasably coupling the micro-electrical-mechanical system (MEMS) device to a wafer from which the micro-electrical-mechanical system (MEMS) device was made.

One or more of the following features may be included. The one or more slidable connection assemblies may include a portion of the wafer. The portion of the wafer may include a supporting pillar on the wafer. The micro-electrical-mechanical system (MEMS) device may include a MEMS actuation core and a MEMS electrical connector assembly electrically coupled to the MEMS actuation core and configured to be electrically coupled to a printed circuit board. The one or more slidable connection assemblies may include a portion of the MEMS actuation core. The one or more slidable connection assemblies may include a portion of the MEMS electrical connector. The one or more slidable connection assemblies may include one or more finger assemblies on the micro-electrical-mechanical system (MEMS) device. The one or more slidable connection assemblies may include one or more socket assemblies on the wafer that are configured to receive the one or more finger assemblies. The one or more socket assemblies on the wafer may include a spanning structure configured to span at least two fingers of the wafer, thus forming the one or more socket assemblies therebetween. The one or more slidable connection assemblies may include one or more finger assemblies on the wafer. The one or more slidable connection assemblies may include one or more socket assemblies on the micro-electrical-mechanical system (MEMS) device that are configured to receive the one or more finger assemblies. The one or more socket assemblies on the micro-electrical-mechanical system (MEMS) device may include a spanning structure configured to span at least two fingers of the micro-electrical-mechanical system (MEMS) device, thus forming the one or more socket assemblies therebetween.

In another implementation, a micro-electrical-mechanical system (MEMS) device includes a MEMS actuation core, a MEMS electrical connector assembly electrically coupled to the MEMS actuation core and configured to be electrically coupled to a printed circuit board, and one or more slidable connection assemblies for releasably coupling the micro-electrical-mechanical system (MEMS) device to a wafer from which the micro-electrical-mechanical system (MEMS) device was made.

One or more of the following features may be included. The one or more slidable connection assemblies may include a portion of the wafer. The portion of the wafer may include a supporting pillar on the wafer. The one or more slidable connection assemblies may include a portion of the MEMS actuation core. The one or more slidable connection assemblies may include a portion of the MEMS electrical connector.

In another implementation, a micro-electrical-mechanical system (MEMS) device includes a MEMS actuation core, a MEMS electrical connector assembly electrically coupled to the MEMS actuation core and configured to be electrically coupled to a printed circuit board and one or more slidable connection assemblies for releasably coupling the micro-electrical-mechanical system (MEMS) device to a wafer from which the micro-electrical-mechanical system (MEMS) device was made.

One or more of the following features may be included. The one or more slidable connection assemblies may include one or more finger assemblies on the micro-electrical-mechanical system (MEMS) device and one or more socket assemblies on the wafer that are configured to receive the one or more finger assemblies including a spanning structure configured to span at least two fingers of the wafer, thus forming the one or more socket assemblies therebetween. The one or more slidable connection assemblies may include one or more finger assemblies on the wafer and one or more socket assemblies on the micro-electrical-mechanical system (MEMS) device that are configured to receive the one or more finger assemblies, including a spanning structure configured to span at least two fingers of the micro-electrical-mechanical system (MEMS) device, thus forming the one or more socket assemblies therebetween.

The details of one or more implementations are set forth in the accompanying drawings and the description below. Other features and advantages will become apparent from the description, the drawings, and the claims.

BRIEF DESCRIPTION OF THE DRAWINGS

FIG. 10 is a cross-sectional detail view of a deformed out-of-plane actuator in accordance with various embodiments of the present disclosure;

Like reference symbols in the various drawings indicate like elements.

DETAILED DESCRIPTION OF THE PREFERRED EMBODIMENTS

System Overview

Figure 1:
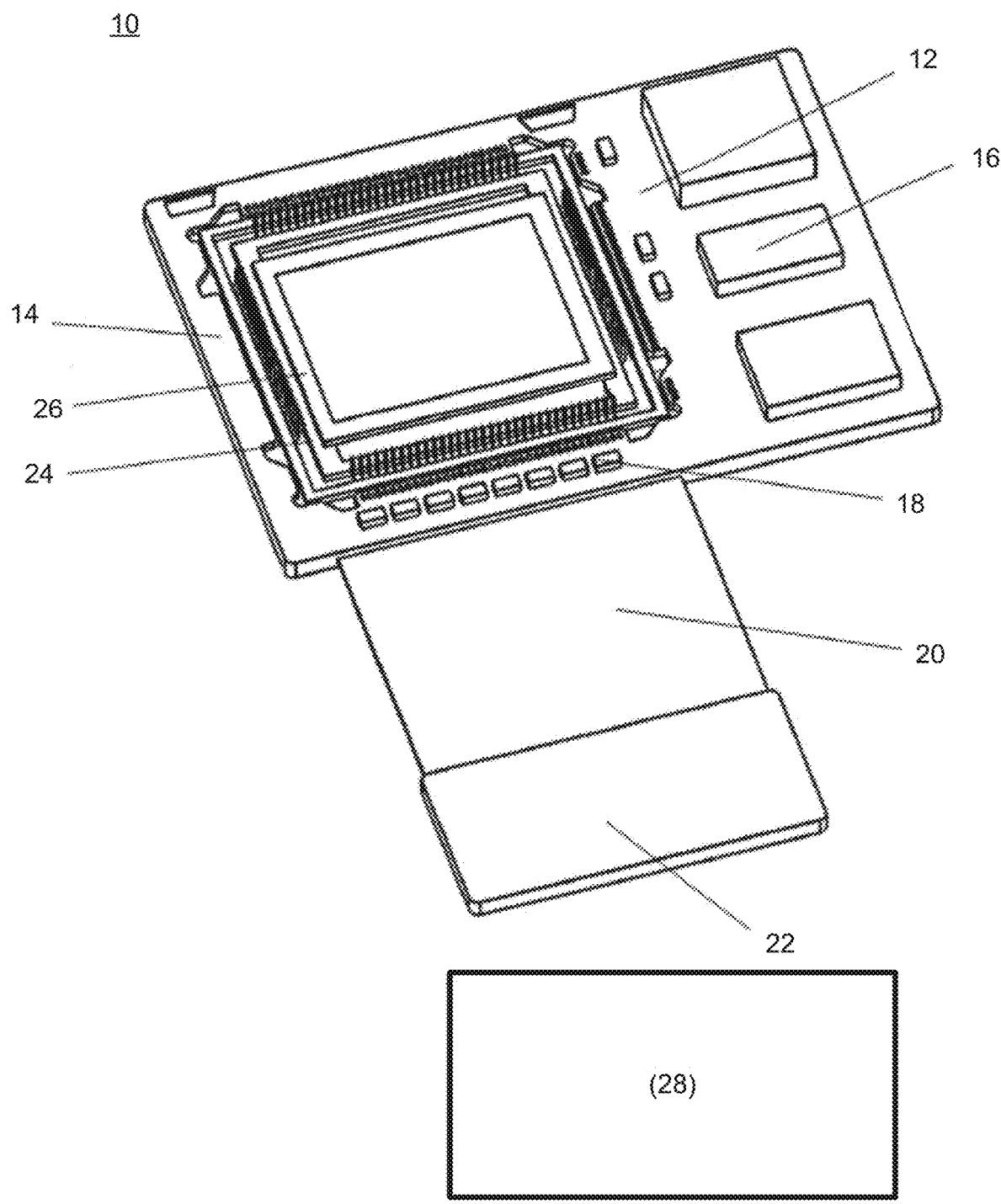
FIG. 1 is a perspective view of a package in accordance with various embodiments of the present disclosure.

Referring to FIG. 1, there is shown MEMS package 10, in accordance with various aspects of this disclosure. In this example, package 10 is shown to include printed circuit board 12, micro-electrical-mechanical system (MEMS) assembly 14, driver circuits 16, electronic components 18, flexible circuit 20, and electrical connector 22. Micro-electrical-mechanical system (MEMS) assembly 14 may include micro-electrical-mechanical system (MEMS) actuator 24 and optoelectronic device 26 mounted to micro-electrical-mechanical system (MEMS) actuator 24.

Examples of micro-electrical-mechanical system (MEMS) actuator 24 may include but are not limited to an in-plane MEMS actuator, an out-of-plane MEMS actuator, and a combination in-plane/out-of-plane MEMS actuator. For example and if micro-electrical-mechanical system (MEMS) actuator 24 is an in-plane MEMS actuator, the in-plane MEMS actuator may include an electrostatic comb drive actuation system (as will be discussed below in greater detail). Additionally, if micro-electrical-mechanical system (MEMS) actuator 24 is an out-of-plane MEMS actuator, the out-of-plane MEMS actuator may include a piezoelectric actuation system or electrostatic actuation. And if micro-electrical-mechanical system (MEMS) actuator 24 is a hybrid in-plane/out-of-plane MEMS actuator, the combination in-plane/out-of-plane MEMS actuator may include an electrostatic comb drive actuation system and a piezoelectric actuation system.

As will be discussed below in greater detail, examples of optoelectronic device 26 may include but are not limited to an image sensor, a holder assembly, a UV filter, an autofocus assembly and/or a lens assembly. Examples of electronic components 18 may include but are not limited to various electronic or semiconductor components and devices. Flexible circuit 20 and/or connector 22 may be configured to electrically couple MEMS package 10 to e.g., a smart phone or a digital camera (represented as generic item 28).

As will be discussed below in greater detail, micro-electrical-mechanical system (MEMS) actuator 24 may be sized so that it may fit within a recess in printed circuit board 12. The depth of this recess within printed circuit board 12 may vary depending upon the particular embodiment and the physical size of micro-electrical-mechanical system (MEMS) actuator 24.

In some embodiments, some of the components of MEMS package 10 may be joined together using various epoxies/adhesives. For example and as will be discussed below in greater detail, an outer frame of micro-electrical-mechanical system (MEMS) actuator 24 may include contact pads that may correspond to similar contact pads on printed circuit board 12.

Figure 2A:
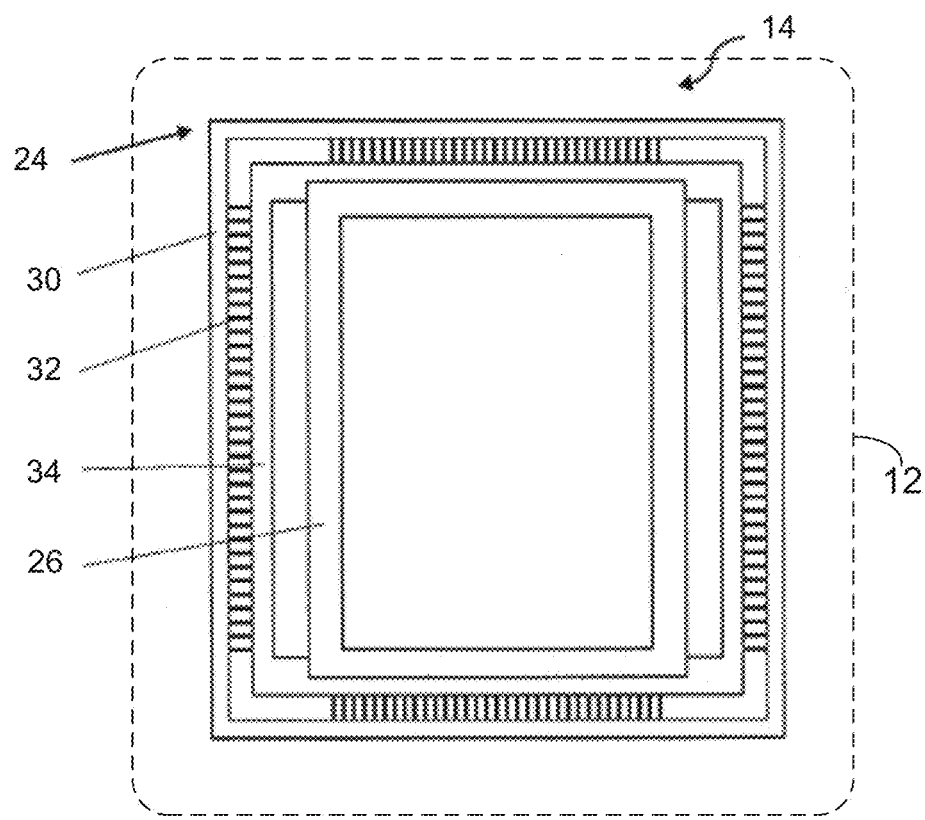
FIG. 2A is a diagrammatic view of an in-plane MEMS actuator with the optoelectronic device in accordance with various embodiments of the present disclosure.

Referring also to FIG. 2A, there is shown micro-electrical-mechanical system (MEMS) assembly 14, which may include optoelectronic device 26 mounted to micro-electrical-mechanical system (MEMS) actuator 24. Micro-electrical-mechanical system (MEMS) actuator 24 may include outer frame 30, plurality of electrically conductive flexures 32, MEMS actuation core 34 for attaching a payload (e.g., a device), and attached optoelectronic device 26. Optoelectronic device 26 may be affixed to MEMS actuation core 34 of micro-electrical-mechanical system (MEMS) actuator 24 by epoxy (or various other adhesives/materials and/or bonding methods).

Figure 2B:
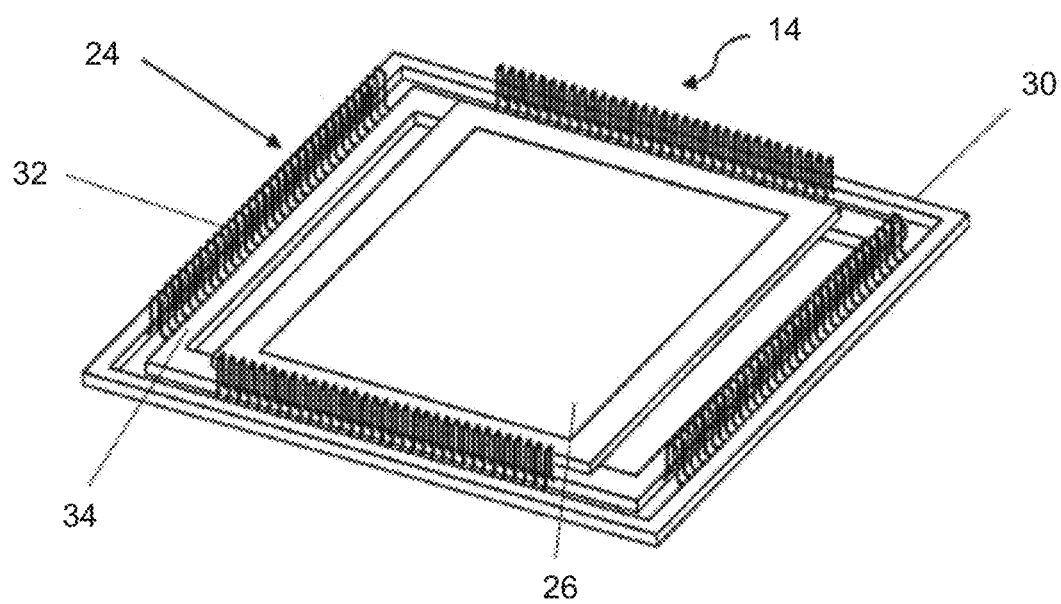
FIG. 2B is a perspective view of an in-plane MEMS actuator with the optoelectronic device in accordance with various embodiments of the present disclosure.

Referring also to FIG. 2B, plurality of electrically conductive flexures 32 of micro-electrical-mechanical system (MEMS) actuator 24 may be curved upward and buckled to achieve the desired level of flexibility. In the illustrated embodiment, plurality of electrically conductive flexures 32 may have one end attached to MEMS actuation core 34 (e.g., the moving portion of micro-electrical-mechanical system (MEMS) actuator 24) and the other end attached to outer frame 30 (e.g., the fixed portion of micro-electrical-mechanical system (MEMS) actuator 24).

Plurality of electrically conductive flexures 32 may be conductive wires that may extend above the plane (e.g., an upper surface) of micro-electrical-mechanical system (MEMS) actuator 24 and may electrically couple laterally separated components of micro-electrical-mechanical system (MEMS) actuator 24. For example, plurality of electrically conductive flexures 32 may provide electrical signals from optoelectronic device 26 and/or MEMS actuation core 34 to outer frame 30 of micro-electrical-mechanical system (MEMS) actuator 24. As discussed above, outer frame 30 of micro-electrical-mechanical system (MEMS) actuator 24 may be affixed to circuit board 12 using epoxy (or various other adhesive materials or devices).

Figure 3A:
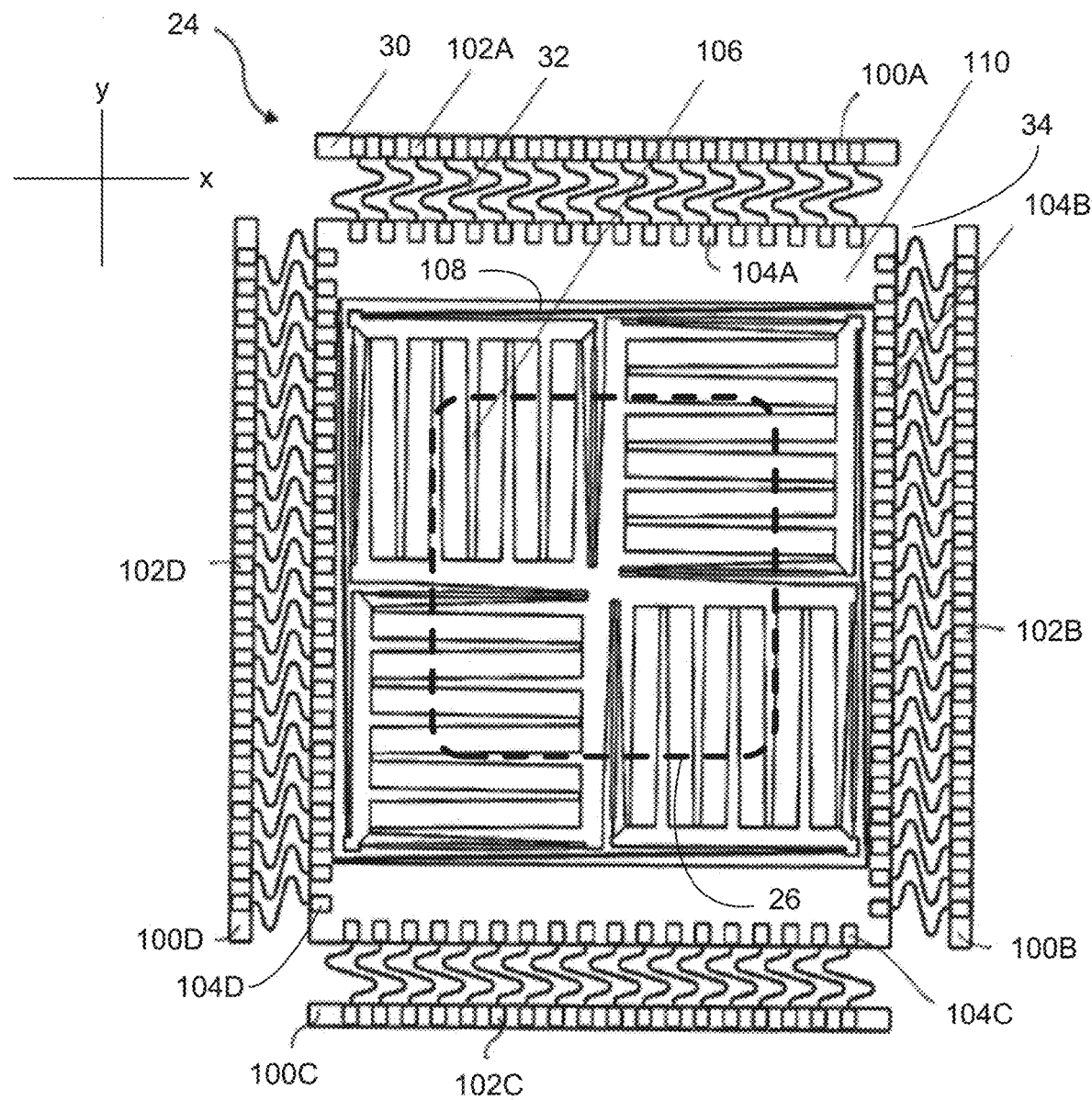
FIG. 3A is a diagrammatic view of an in-plane MEMS actuator in accordance with various embodiments of the present disclosure.

Referring also to FIG. 3A, there is shown a top view of micro-electrical-mechanical system (MEMS) actuator 24 in accordance with various embodiments of the disclosure. Outer frame 30 is shown to include (in this example) four frame assemblies (e.g., frame assembly 100A, frame assembly 100B, frame assembly 100C, frame assembly 100D) that are shown as being spaced apart to allow for additional detail. However and during assembly, frame assembly 100A, frame assembly 100B, frame assembly 100C and frame assembly 100D may be coupled (or latched) together to form outer frame 30 (as will be discussed below in greater detail). Conversely and in other embodiments, frame assembly 100A, frame assembly 100B, frame assembly 100C and frame assembly 100D may not be joined together and may be left as separate assemblies (although this is typically not the case).

Outer frame 30 of micro-electrical-mechanical system (MEMS) actuator 24 may include a plurality of contact pads (e.g., contact pads 102A on frame assembly 100A, contact pads 102B on frame assembly 100B, contact pads 102C on frame assembly 100C, and contact pads 102D on frame assembly 100D), which may be electrically coupled to one end of plurality of electrically conductive flexures 32. The curved shape of electrically conductive flexures 32 is provided for illustrative purposes only and, while illustrating one possible embodiment, other configurations are possible and are considered to be within the scope of this disclosure.

MEMS actuation core 34 may include a plurality of contact pads (e.g., contact pads 104A, contact pads 104B, contact pads 104C, contact pads 104D), which may be electrically coupled to the other end of plurality of electrically conductive flexures 32. A portion of the contact pads (e.g., contact pads 104A, contact pads 104B, contact pads 104C, contact pads 104D) of MEMS actuation core 34 may be electrically coupled to optoelectronic device 26 by wire bonding, silver paste, or eutectic seal, thus allowing for the electrical coupling of optoelectronic device 26 to outer frame 30.

MEMS actuation core 34 may include one or more comb drive sectors (e.g., comb drive sector 106) that are actuation sectors disposed within micro-electrical-mechanical system (MEMS) actuator 24. The comb drive sectors (e.g., comb drive sector 106) within MEMS actuation core 34 may be disposed in the same plane and may be positioned orthogonal to each other to allow for movement in two axes (e.g., the x-axis and the y-axis).

While in this particular example, MEMS actuation core 34 is shown to include four comb drive sectors, this is for illustrative purposes only and is not intended to be a limitation of this disclosure, as other configurations are possible. For example, the number of comb drive sectors may be increased or decreased depending upon design criteria.

While in this particular example, the four comb drive sectors are shown to be generally square in shape, this is for illustrative purposes only and is not intended to be a limitation of this disclosure, as other configurations are possible. For example, the shape of the comb drive sectors may be changed to meet various design criteria.

Each comb drive sector (e.g., comb drive sector 106) within MEMS actuation core 34 may include one or more moving portions and one or more fixed portions. As will be discussed below in greater detail, a comb drive sector (e.g., comb drive sector 106) within MEMS actuation core 34 may be coupled, via a cantilever assembly (e.g., cantilever assembly 108), to outer periphery 110 of MEMS actuation core 34 (i.e., the portion of MEMS actuation core 34 that includes contact pads 104A, contact pads 104B, contact pads 104C, contact pads 104D), which is the portion of MEMS actuation core 34 to which optoelectronic device 26 may be coupled, thus effectuating the transfer of movement to optoelectronic device 26.

Multi-Piece Outer Frame (Invention #6)

As discussed above, outer frame 30 is shown to include (in this example) four frame assemblies (e.g., frame assembly 100A, frame assembly 100B, frame assembly 100C, frame assembly 100D) that are shown as being spaced apart to allow for additional detail. However, during assembly, frame assembly 100A, frame assembly 100B, frame assembly 100C, and frame assembly 100D may be coupled together to form outer frame 30.

Figure 3B:
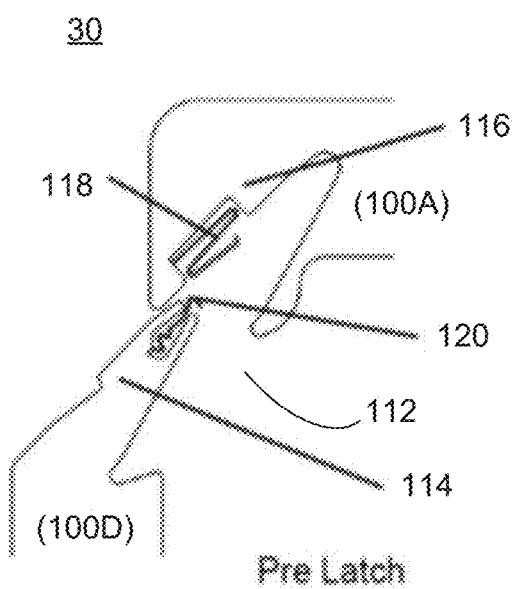
FIGS. 3B-3C are diagrammatic views of a coupling assembly included within the in-plane MEMS actuator of FIG. 3A in accordance with various embodiments of the present disclosure.
Figure 3C:
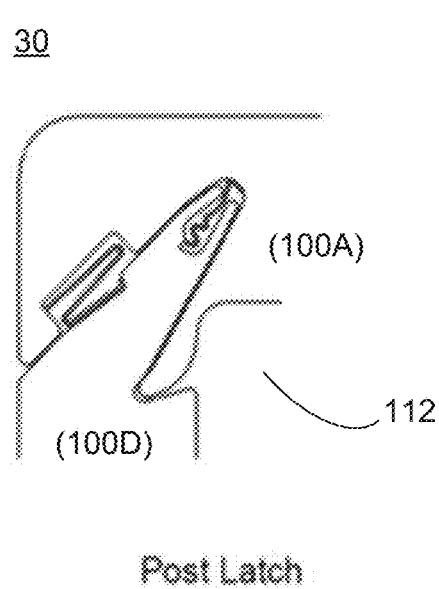

Accordingly and referring also to FIGS. 3B-3C, micro-electrical-mechanical system (MEMS) actuator 24 may include MEMS actuation core 34, and a multi-piece MEMS electrical connector assembly (e.g., outer frame 30) electrically coupled to MEMS actuation core 34 and configured to be electrically coupled to printed circuit board 12. Multi-piece MEMS electrical connector (e.g., outer frame 30) may include: a plurality of subcomponents (e.g., frame assembly 100A, frame assembly 100B, frame assembly 100C, frame assembly 100D), and a plurality of coupling assemblies (e.g., coupling assembly 112) configured to couple the plurality of subcomponents together (e.g., frame assembly 100A, frame assembly 100B, frame assembly 100C, frame assembly 100D).

While FIGS. 3B-3C only shows frame assembly 100A and frame assembly 100D being coupled together using coupling assembly 112, this is for illustrative purposes only. For example, frame assembly 100A and frame assembly 100B may be coupled using another coupling assembly; frame assembly 100B and frame assembly 100C may be coupled using another coupling assembly; and frame assembly 100C and frame assembly 100D may be coupled using another coupling assembly.

As discussed above, plurality of electrically conductive flexures 32 of micro-electrical-mechanical system (MEMS) actuator 24 may be curved upward and buckled to achieve the desired level of flexibility. Specifically, plurality of electrically conductive flexures 32 may be configured to be generally flat in shape when the plurality of subcomponents (e.g., frame assembly 100A, frame assembly 100B, frame assembly 100C, frame assembly 100D) are uncoupled. And prior to attaching micro-electrical-mechanical system (MEMS) actuator 24 to printed circuit board 12, frame assembly 100A, frame assembly 100B, frame assembly 100C, frame assembly 100D may be coupled together. Further, plurality of electrically conductive flexures 32 may be configured to be generally arched in shape when the plurality of subcomponents (e.g., frame assembly 100A, frame assembly 100B, frame assembly 100C, frame assembly 100D) are coupled together.

The plurality of coupling assemblies (e.g., coupling assembly 112) may include latch bolt 114 and latch catch 116 configured to engage latch bolt 114. Each latch catch 116 may include tumbler spring 118 for engaging a recess in latch bolt 114. Further, each latch bolt 114 may include push spring 120 configured to bias the recess of latch bolt 114 against tumbler spring 118.

As will be discussed below in greater detail, the multi-piece MEMS electrical connector assembly (e.g., outer frame 30) may be configured to be rigidly attached to and wire bound to printed circuit board 12 via a plurality of wire bond connections, wherein this plurality of wire bond connections may be encapsulated in epoxy to provide added strength and durability.

Figure 4:
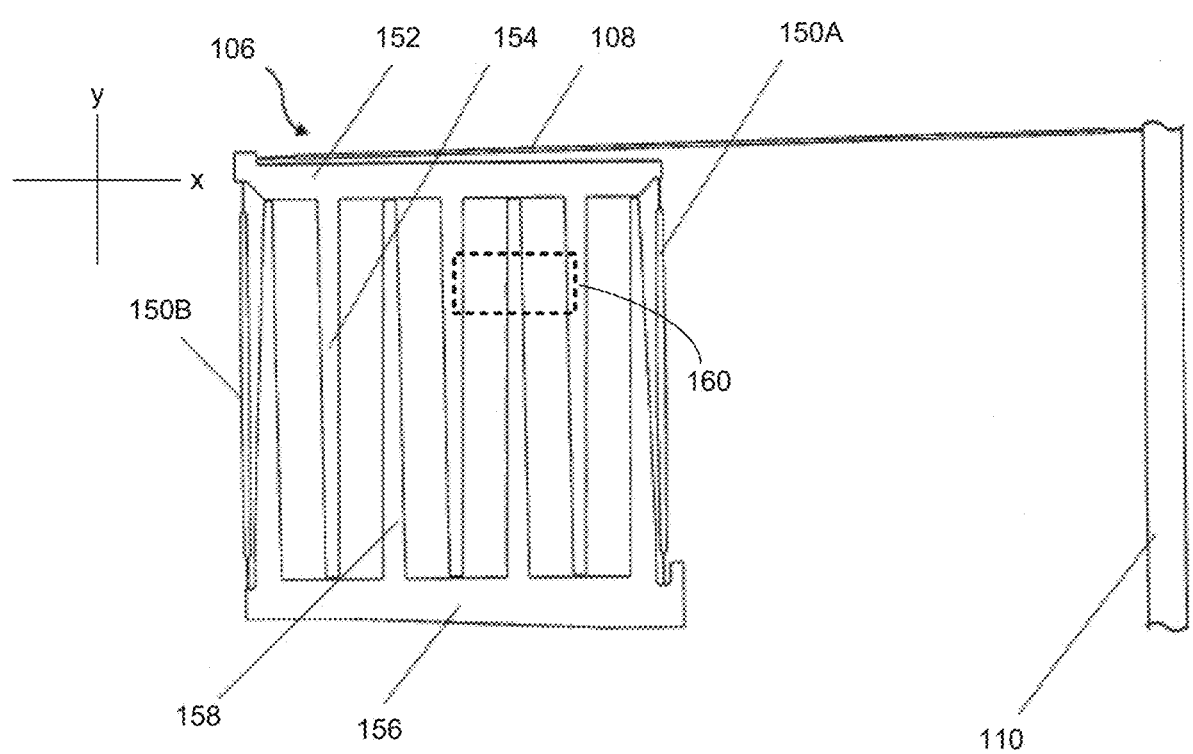
FIG. 4 is a diagrammatic view of a comb drive sector in accordance with various embodiments of the present disclosure.

Referring also to FIG. 4, there is shown a top view of comb drive sector 106 in accordance with various embodiments of the present disclosure. Each comb drive sector (e.g., comb drive sector 106) may include one or more motion control cantilever assemblies (e.g., motion control cantilever assemblies 150A, 150B) positioned outside of comb drive sector 106, moveable frame 152, moveable spines 154, fixed frame 156, fixed spines 158, and cantilever assembly 108 that is configured to couple moving frame 152 to outer periphery 110 of MEMS actuation core 34. In this particular configuration, motion control cantilever assemblies 150A, 150B may be configured to prevent y-axis displacement between moving frame 152/moveable spines 154 and fixed frame 156/fixed spines 158.

Comb drive sector 106 may include a movable member including moveable frame 152 and multiple moveable spines 154 that are generally orthogonal to moveable frame 152. Comb drive sector 106 may also include a fixed member including fixed frame 156 and multiple fixed spines 158 that are generally orthogonal to fixed frame 156. Cantilever assembly 108 may be deformable in one direction (e.g., in response to y-axis deflective loads) and rigid in another direction (e.g., in response to x-axis tension and compression loads), thus allowing for cantilever assembly 108 to absorb motion in the y-axis but transfer motion in the x-axis.

Figure 5:
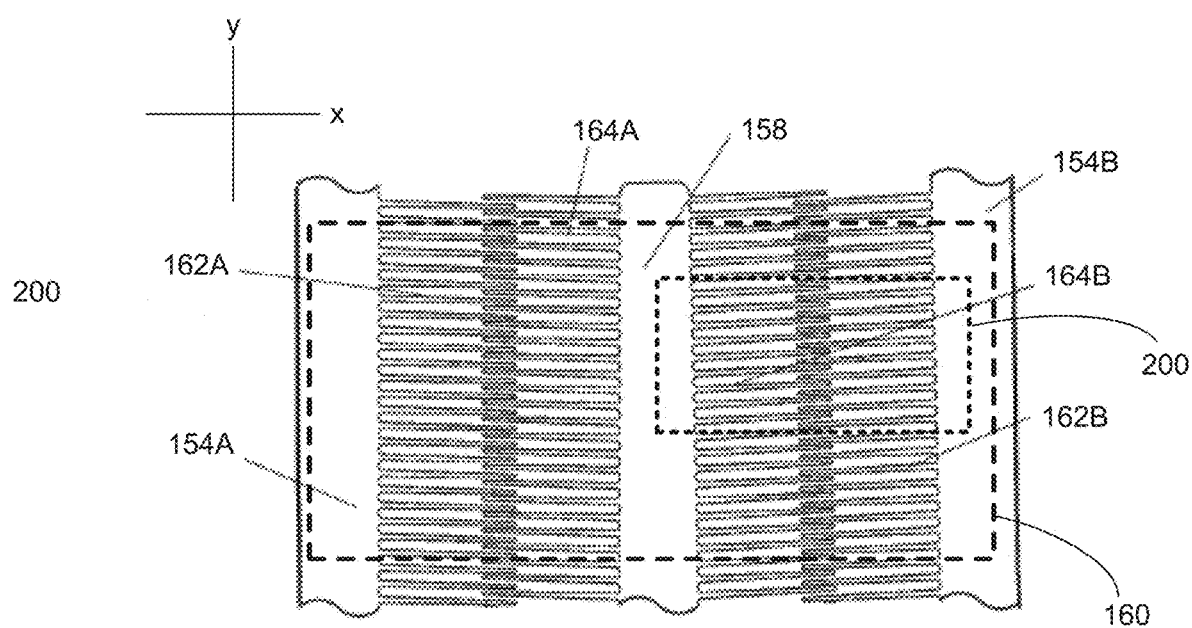
FIG. 5 is a diagrammatic view of a comb pair in accordance with various embodiments of the present disclosure.

Referring also to FIG. 5, there is shown a detail view of portion 160 of comb drive sector 106. Moveable spines 154A, 154B may include a plurality of discrete moveable actuation fingers that are generally orthogonally-attached to moveable spines 154A, 154B. For example, moveable spine 154A is shown to include moveable actuation fingers 162A and moveable spine 154B is shown to include moveable actuation fingers 162B.

Further, fixed spine 158 may include a plurality of discrete fixed actuation fingers that are generally orthogonally-attached to fixed spine 158. For example, fixed spine 158 is shown to include fixed actuation fingers 164A that are configured to mesh and interact with moveable actuation fingers 162A. Further, fixed spine 158 is shown to include fixed actuation fingers 164B that are configured to mesh and interact with moveable actuation fingers 162B.

Accordingly, various numbers of actuation fingers may be associated with (i.e. coupled to) the moveable spines (e.g., moveable spines 154A, 154B) and/or the fixed spines (e.g., fixed spine 158) of comb drive sector 106. As discussed above, each comb drive sector (e.g., comb drive sector 106) may include two motion control cantilever assemblies 150A, 150B separately placed on each side of comb drive sector 106. Each of the two motion control cantilever assemblies 150A, 150B may be configured to couple moveable frame 152 and fixed frame 156, as this configuration enables moveable actuation fingers 162A, 162B to be displaceable in the x-axis with respect to fixed actuation fingers 164A, 164B (respectively) while preventing moveable actuation fingers 162A, 162B from being displaced in the y-axis and contacting fixed actuation fingers 164A, 164B (respectively).

While actuation fingers 162A, 162B, 164A, 164B (or at least the center axes of actuation fingers 162A, 162B, 164A, 164B) are shown to be generally parallel to one another and generally orthogonal to the respective spines to which they are coupled, this is for illustrative purposes only and is not intended to be a limitation of this disclosure, as other configurations are possible. Further and in some embodiments, actuation fingers 162A, 162B, 164A, 164B may have the same width throughout their length and in other embodiments, actuation fingers 162A, 162B, 164A, 164B may be tapered.

Further and in some embodiments, moveable frame 152 may be displaced in the positive x-axis direction when a voltage potential is applied between actuation fingers 162A and actuation fingers 164A, while moveable frame 152 may be displaced in the negative x-axis direction when a voltage potential is applied between actuation fingers 162B and actuation fingers 164B.

Figure 6A:
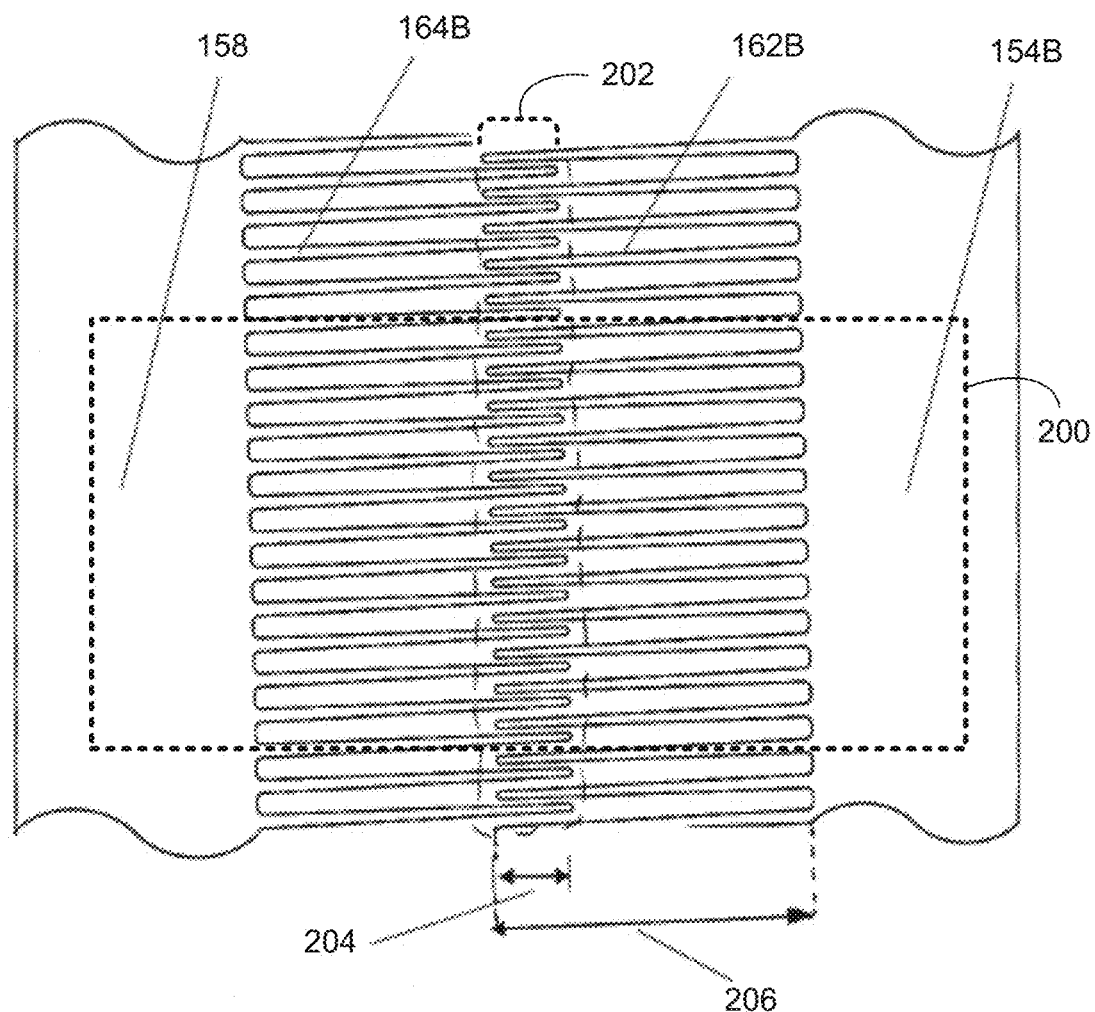
FIG. 6A is a diagrammatic view of fingers of the comb pair of FIG. 5 in accordance with various embodiments of the present disclosure.

Referring also to FIG. 6A, there is shown a detail view of portion 200 of comb drive sector 106. Fixed spine 158 may be generally parallel to moveable spine 154B, wherein actuation fingers 164B and actuation fingers 162B may overlap within region 202, wherein the width of overlap region 202 is typically in the range of 10-50 microns. While overlap region 202 is described as being in the range of 10-50 microns, this is for illustrative purposes only and is not intended to be a limitation of this disclosure, as other configurations are possible.

Overlap region 202 may represent the distance 204 where the ends of actuation fingers 162B extends past and overlap the ends of actuation fingers 164B, which are interposed therebetween. In some embodiments, actuation fingers 162B and actuation fingers 164B may be tapered such that their respective tips are narrower than their respective bases (i.e., where they are attached to their spines). As is known in the art, various degrees of taper may be utilized with respect to actuation fingers 162B and actuation fingers 164B. Additionally, the overlap of actuation fingers 162B and actuation fingers 164B provided by overlap region 202 may help ensure that there is sufficient initial actuation force when an electrical voltage potential is applied so that MEMS actuation core 34 may move gradually and smoothly without any sudden jumps with varying the applied voltage. The height of actuation fingers 162B and actuation fingers 164B may be determined by various aspects of the MEMS fabrication process and various design criteria.

Length 206 of actuation fingers 162B and actuation fingers 164B, the size of overlap region 202, the gaps between adjacent actuation fingers, and actuation finger taper angles that are incorporated into various embodiments may be determined by various design criteria, application considerations, and manufacturability considerations, wherein these measurements may be optimized to achieve the required displacement utilizing the available voltage potential.

Cantilever Stress Reduction System (Invention #2)

As discussed above, cantilever assembly 108 may be configured to couple moving frame 152 of comb drive sector 106 and outer periphery 110 of MEMS actuation core 34. Referring also to FIGS. 6B-6E, in order to mitigate the impact of any z-axis shock load experienced by cantilever assembly 108, a cantilever stress reduction system may be utilized. For example, cantilever assembly 108 may include: intermediary cantilever portion 208; main cantilever arm 210 configured to couple a moveable portion of a micro-electrical-mechanical system (MEMS) actuator 24 and intermediary cantilever portion 208; and a plurality of intermediary links (e.g., intermediary links 212, 214, 216, 218) configured to couple intermediary cantilever portion 208 to a portion of micro-electrical-mechanical system (MEMS) actuator 24.

Figure 6B:
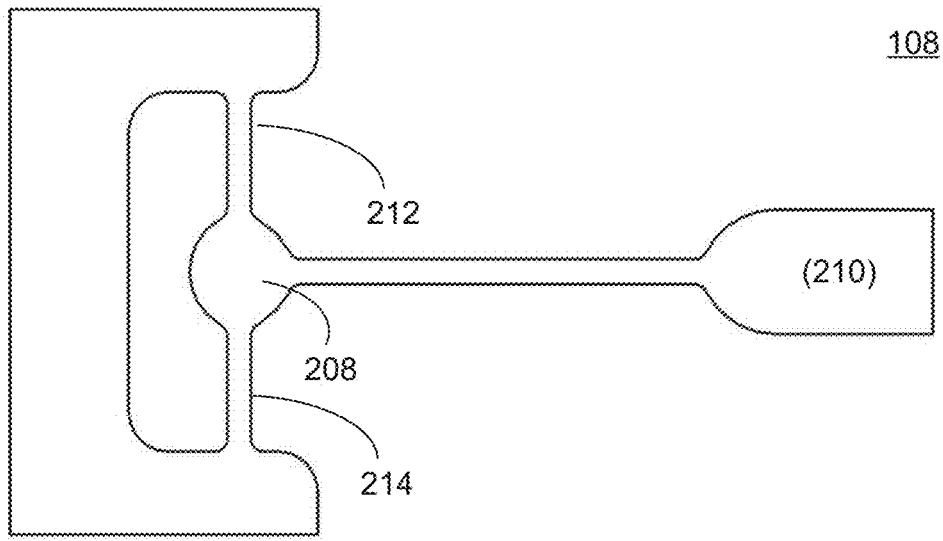
FIG. 6B-6F are diagrammatic views of a cantilever stress reduction system in accordance with various embodiments of the present disclosure.
Figure 6C:
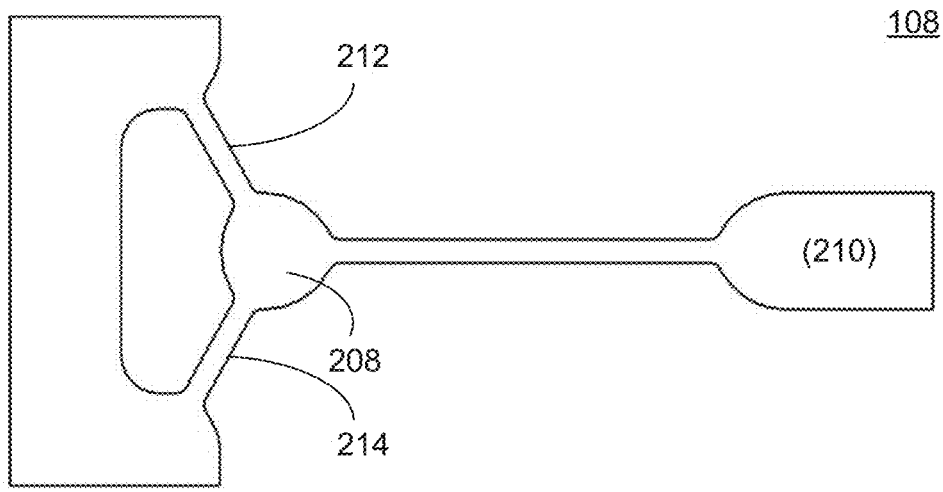
Figure 6D:
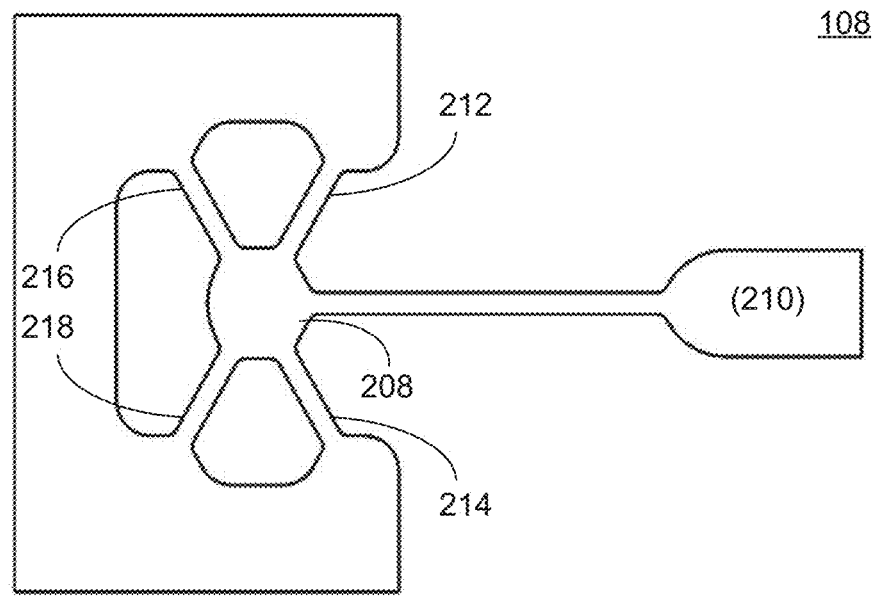
Figure 6E:
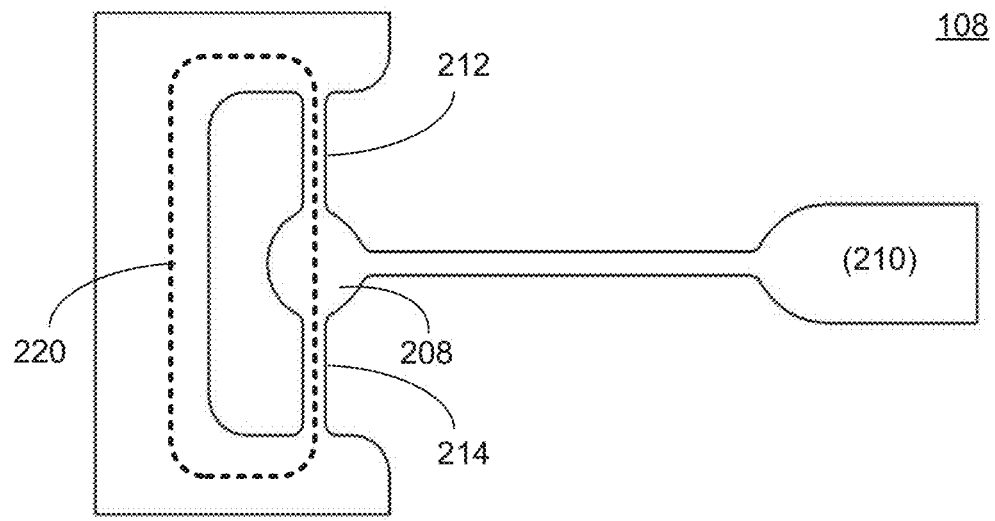

For example, the cantilever stress reduction system shown in FIG. 6B is shown to include intermediary links 212, 214; the cantilever stress reduction system shown in FIG. 6C is shown to include intermediary links 212, 214; the cantilever stress reduction system shown in FIG. 6D is shown to include intermediary links 212, 214, 216, 218; and the cantilever stress reduction system shown in FIG. 6E is shown to include intermediary links 212, 214. Some or all of plurality of intermediary links 212, 214, 216, 218 may be coupled to a moveable portion of micro-electrical-mechanical system (MEMS) actuator 24 (e.g., moveable frame 152 and moveable spines 154) or a non-moveable portion of micro-electrical-mechanical system (MEMS) actuator 24 (e.g., outer periphery 110)

In some embodiments, main cantilever arm 210 may include a first distal end coupled to the moveable portion (e.g., moveable frame 152 and moveable spines 154) of micro-electrical-mechanical system (MEMS) actuator 24 and a second distal end coupled to intermediary cantilever portion 208.

Some embodiments of plurality of intermediary links 212, 214, 216, 218 may include two intermediary links (e.g., intermediary links 212, 214) configured to be non-parallel to main cantilever arm 210 (as shown in FIGS. 6B, 6C and 6E) or essentially orthogonal to main cantilever arm 210 (as shown in FIGS. 6B and 6E). Other embodiments of plurality of intermediary links 212, 214, 216, 218 may include four intermediary links configured to be non-parallel to main cantilever arm 210 (as shown in FIG. 6D).

Specifically, plurality of intermediary links 212, 214, 216, 218 may be configured to absorb out-of-plane (z-axis) motion of the moveable portion (e.g., moveable frame 152 and moveable spines 154) of micro-electrical-mechanical system (MEMS) actuator 24. For example, some or all of the plurality of intermediary links 212, 214, 216, 218 may be configured to torsionally-twist to absorb out-of-plane motion (z-axis) of the moveable portion (e.g., moveable frame 152 and moveable spines 154) of micro-electrical-mechanical system (MEMS) actuator 24. To provide for additional strength, planar spanning structure 220 may be configured to couple an upper surface of intermediary cantilever portion 208 to an upper surface of one or more of the plurality of intermediary links 212, 214, 216, 218. Planar spanning structure 220 may be made by depositing a layer of material (e.g., polysilicon, metals (such as aluminum, titanium, copper, tungsten), amorphous diamond, oxides (such as silicon oxide, aluminum oxide, or other metal oxide), nitrides (such as silicon nitride, metal nitride), carbides (such as silicon carbide, metal carbide), etc., or combined layers thereof) to span the upper surface of intermediary cantilever portion 208 and the upper surface of one or more of the plurality of intermediary links 212, 214, 216, 218.

As discussed above and in order to mitigate the impact of any z-axis shock load experienced by cantilever assembly 108, a cantilever stress reduction system may be utilized. In the implantations shown in FIGS. 6A-6E, cantilever assembly 108 is shown to include: intermediary cantilever portion 208; main cantilever arm 210 configured to couple a moveable portion of a micro-electrical-mechanical system (MEMS) actuator 24 and intermediary cantilever portion 208; and a plurality of intermediary links (e.g., intermediary links 212, 214, 216, 218) configured to couple intermediary cantilever portion 208 to a portion of micro-electrical-mechanical system (MEMS) actuator 24.

Accordingly, it is understood that other configurations are possible and are considered to be within the scope of this disclosure and claims. For example, the above-described cantilever stress reduction system may be utilized on each end of cantilever assembly 108. Accordingly, each end of main cantilever arm 210 may be coupled to an intermediary cantilever portion (e.g., intermediary cantilever portion 208), wherein a first of these intermediary cantilever portions may be utilized to couple a first end of main cantilever arm 210 (of cantilever assembly 108) to moving frame 152 and a second of these intermediary cantilever portions may be utilized to couple a second end of main cantilever arm 210 (of cantilever assembly 108) to outer periphery 110 of MEMS actuation core 34.

Finger Array Snubbing (Invention #1)

As discussed above, micro-electrical-mechanical system (MEMS) actuator 24 may include a plurality of actuation fingers, which includes moveable actuation fingers 162B (coupled to moveable frame 152 and moveable spine 154B) and fixed actuation fingers 164B (coupled to fixed frame 156 and fixed spines 158). As discussed above, moveable actuation fingers 162B are displaceable along the x-axis and essentially non-displaceable along the y-axis.

Figure 6F:
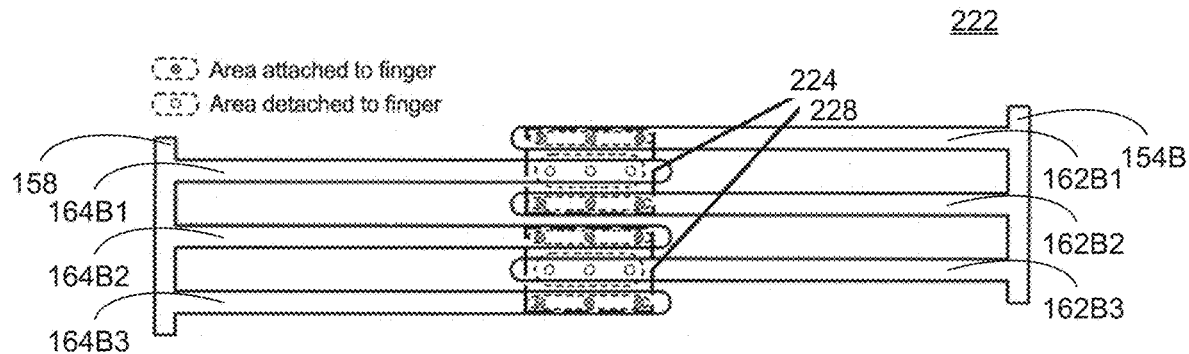
Figures 6G, 6H:
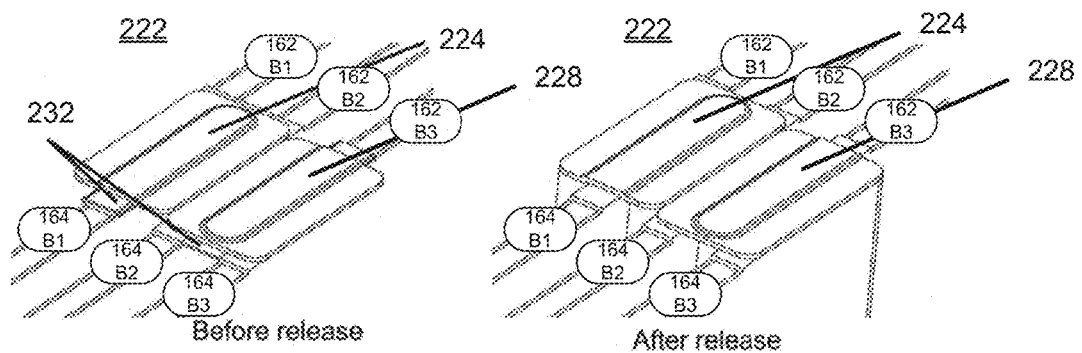
FIG. 6G-6L are diagrammatic views of a finger array snubbing system in accordance with various embodiments of the present disclosure.

Referring also to FIGS. 6F-6H, in order to mitigate the impact of any z-axis shock load experienced by the plurality of actuation fingers and any deformation experienced by the motion-control cantilevers, finger array snubbing system 222 may be utilized to mitigate displacement along the z-axis. Micro-electrical-mechanical system (MEMS) actuator 24 may include a first set of actuation fingers (e.g., moveable actuation fingers 162B1, 162B2, 162B3) and a second set of actuation fingers (e.g., fixed actuation fingers 164B1, 164B2, 164B3), wherein these actuation fingers may be constructed of silicon (or any other suitable material).

First spanning structure (e.g., spanning structure 224) configured to couple at least two fingers (e.g., actuation fingers 162B1, 162B2) of first set of actuation fingers (e.g., moveable actuation fingers 162B1, 162B2, 162B3) while spanning at least one finger (e.g., actuation finger 164B1) of second set of actuation fingers (e.g., fixed actuation fingers 164B1, 164B2, 164B3). First spanning structure 224 may be constructed of metallic material, examples of which may include but are not limited to polysilicon, metals (such as aluminum, titanium, copper, tungsten), amorphous diamond, oxides (such as silicon oxide, aluminum oxide, or other metal oxide), nitrides (such as silicon nitride, metal nitride), carbides (such as silicon carbide, metal carbide), etc., or combined layers thereof.

First spanning structure 224 may be configured to span the at least one finger (e.g., actuation finger 164B1) of second set of actuation fingers (e.g., fixed actuation fingers 164B1, 164B2, 164B3) at a distance configured to define a maximum level of first-axis/first-direction (i.e., z-axis) deflection for the at least one finger (e.g., actuation finger 164B1) of the second set of actuation fingers (e.g., fixed actuation fingers 164B1, 164B2, 164B3). First spanning structure 224 may be configured to define a gap between first spanning structure 224 and the at least one finger (e.g., actuation finger 164B1) of the second set of actuation fingers (e.g., fixed actuation fingers 164B1, 164B2, 164B3), wherein this gap is in the range of 0.1 µm and 5 µm.

Second spanning structure 228 may be configured to couple at least two fingers (e.g., actuation fingers 164B2, 164B3) of second set of actuation fingers (e.g., fixed actuation fingers 164B1, 164B2, 164B3) while spanning at least one finger (e.g., actuation finger 162B3) of the first set of actuation fingers (e.g., moveable actuation fingers 162B1, 162B2, 162B3). Second spanning structure 228 may be constructed of metallic material, examples of which may include but are not limited to polysilicon, metals (such as aluminum, titanium, copper, tungsten), amorphous diamond, oxides (such as silicon oxide, aluminum oxide, or other metal oxide), nitrides (such as silicon nitride, metal nitride), carbides (such as silicon carbide, metal carbide), etc., or combined layers thereof.

Second spanning structure 228 may be configured to span the at least one finger (e.g., actuation finger 162B3) of the first set of actuation fingers (e.g., moveable actuation fingers 162B1, 162B2, 162B3) at a distance configured to define a maximum level of first-axis/second-direction (i.e., z-axis) deflection for the at least two fingers (e.g., actuation fingers 164B2, 164B3) of the second set of actuation fingers (e.g., fixed actuation fingers 164B1, 164B2, 164B3). Second spanning structure 228 may be configured to define a gap between the second spanning structure 228 and the at least one finger (e.g., actuation finger 162B3) of the first set of actuation fingers (e.g., moveable fingers 162B1, 162B2, 162B3), wherein this gap may be in the range of 0.1 µm and 5 µm.

While manufacturing first spanning structure 224 and second spanning structure 228, patches of thin film may be deposited on top of overlapping areas of the finger arrays (e.g., moveable actuation fingers 162B and fixed actuation fingers 164B). Specifically, a patch of thin film may be attached to span three fingers (e.g., for first spanning structure 224, actuation fingers 162B1, 162B2 and 164B1), wherein the thin film is detached from (in this example) actuation finger 164B1 so that the movable finger (e.g., actuation finger 164B1) may move within the tolerated x-axis range.

Accordingly and for first spanning structure 224, moveable actuation fingers 162B1, 162B2 may be prevented from moving downward (i.e., into the page). And for second spanning structure 228, moveable actuation finger 162B3 will be prevented from moving upward (i.e., out of the page).

Sacrificial layers 232 may be constructed of various materials (e.g., polysilicon, metals, oxides, nitrides, carbides, and polymers (such as PMMA, parylene, etc.)) and may be removed during the release process and may leave the above-described gap that controls the maximum amount of z-axis deflection that may be experienced by e.g., moveable actuation fingers 162B1, 162B2, 162B3.

Figure 7:
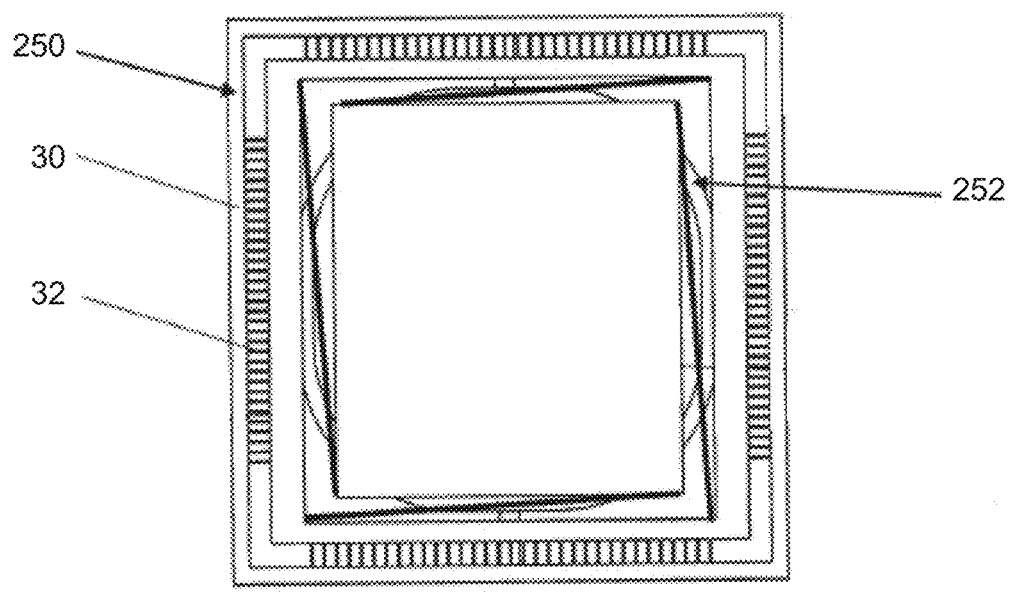
FIG. 7 is a diagrammatic view of a combination of an in-plane MEMS actuator and an out-of-plane actuator in accordance with various embodiments of the present disclosure.

As stated above, examples of micro-electrical-mechanical system (MEMS) actuator 24 may include but are not limited to an in-plane MEMS actuator, an out-of-plane MEMS actuator, and a combination in-plane/out-of-plane MEMS actuator. Referring also to FIG. 7, there is shown a combination in-plane/out-of-plane MEMS actuator that includes in-plane MEMS actuator 250, with out-of-plane actuator 252 attached thereto. As discussed above (and as shown in FIG. 3), micro-electrical-mechanical system (MEMS) actuator 24 may include four comb drive sectors (e.g., comb drive sector 106), wherein out-of-plane actuator 252 may be located in the center of these comb drive sectors. Accordingly, out-of-plane actuator 252 may be located under in-plane MEMS actuator 250 and/or outer frame 30 of in-plane MEMS actuator 250.

Plurality of electrically conductive flexures 32 may be configured to conduct electrical signal within in-plane MEMS actuator 250 and may also provide electrical signal routing to out-of-plane actuator 252. Plurality of electrically conductive flexures 32 may be highly conductivity and may be formed of a metal alloy layer (e.g., aluminum, copper, metal and metal alloys) disposed on multiple layers including but not limited to polysilicon, silicon oxide, silicon or other suitable semiconductor surface.

Plurality of electrically conductive flexures 32 may be designed in such as to provide a low level of stiffness, thus allowing for x-axis and y-axis and/or z-axis movement to provide the degrees of freedom required by in-plane MEMS actuator 250 and/or out-of-plane actuator 252.

While the spanning structures (e.g., first spanning structure 224 and second spanning structure 228) are shown to be essentially rectangular spanning structures that span a single actuation finger, this is for illustrative purposes only and is not intended to be a limitation of this disclosure, as other configurations are possible and are considered to be within the scope of the disclosure. For example and referring also to FIGS. 6I-6L, there is shown other implementations of the spanning structures (e.g., first spanning structure 224 and second spanning structure 228) that are shaped differently and/or span multiple actuation fingers.

Figure 6I:
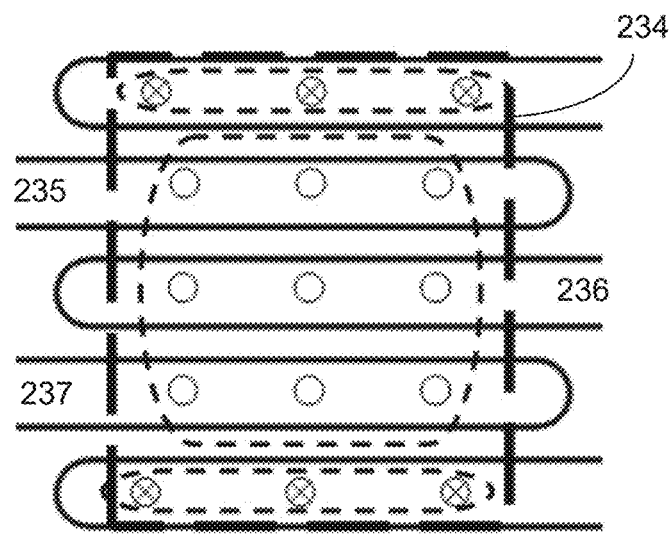
Figure 6K:
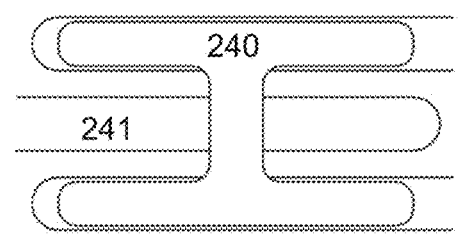
Figure 6J:
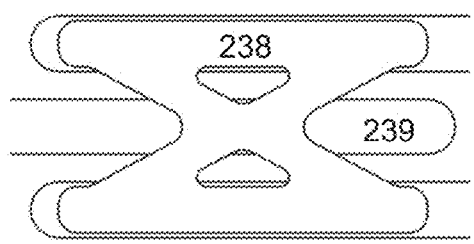
Figure 6L:
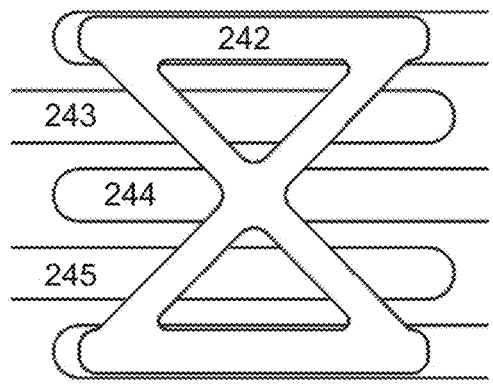

For example and as shown in FIG. 6I, there is shown an essentially rectangular spanning structure (e.g., spanning structure 234) that is shown to span three actuation fingers (e.g., actuation fingers 235, 236, 237). Further and as shown in FIG. 6J, there is shown an essentially X-shaped spanning structures (e.g., spanning structure 238) that is shown to span one actuation finger (e.g., actuation finger 239). Additionally and as shown in FIG. 6K, there is shown an essentially H-shaped spanning structures (e.g., spanning structure 240) that is shown to span one actuation finger (e.g., actuation finger 241). Further and as shown in FIG. 6L, there is shown an essentially X-shaped spanning structure (e.g., spanning structure 242) that is shown to span three actuation fingers (e.g., actuation fingers 243, 244, 245).

Figure 8:
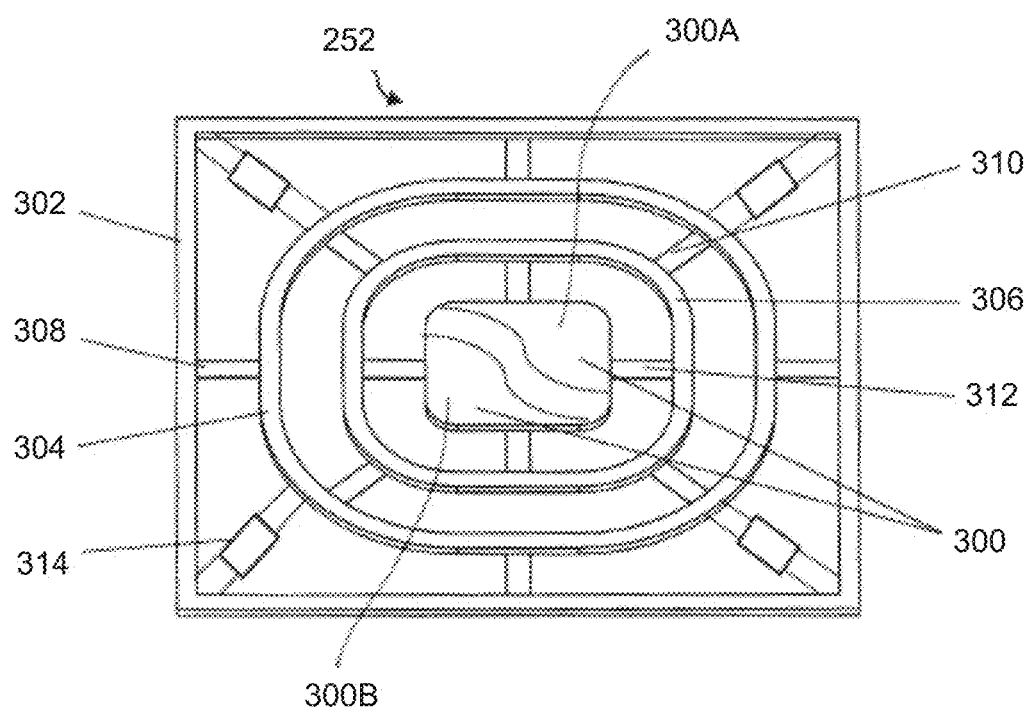
FIG. 8 is a diagrammatic view of an out-of-plane actuator in accordance with various embodiments of the present disclosure.

Referring also to FIG. 8, there is shown a detail view of out-of-plane actuator 252 in accordance with various embodiments of the present disclosure. Examples of out-of-plane actuator 252 may include but are not limited to a piezoelectric actuator. Out-of-plane actuator 252 may be configured to provide actuation in multiple directions including the direction orthogonal to the motion provided by in-plane MEMS actuator 250 (e.g., the z-axis). Out-of-plane actuator 252 may include center stage 300 configured to allow for the attachment of e.g., optoelectronic device 26

(see FIG. 3). Out-of-plane actuator 252 may also include outer frame 302, intermediate stage 304, intermediate stage 306, actuation beams 308, 310, 312 and electrical flexures 314. Actuation beams 308, 310, 312 may be configured to couple center stage 300, intermediate stage 304, intermediate stage 306 and outer frame 302.

While only one set of electrical flexures is shown, this is for illustrative purposes only and is not intended to be a limitation of this disclosure, as other configurations are possible. For example, a set of electrical flexures may also be included between intermediate stages 304, 306, and/or a set of electrical flexures may also be included between intermediate stage 306 and center stage 300. While center stage 300 is shown to be oval in shape, other configurations are possible and are considered to be within the scope of this disclosure.

Z-axis (i.e., out-of-plane) movement of center stage 300 of out-of-plane actuator 252 may be generated due to the deformation of actuation beams 308, 310, 312, which may be formed of a piezoelectric material (e.g., PZT (lead zirconate titanate), zinc oxide or other suitable material) that may be configured to deflect in response to an electrical signal. Actuation beam 308 and electrical flexure 314 may be configured to meet various stiffness requirement and/or allow for the level of deformability needed to achieve a desired level of z-axis movement while prohibiting x-axis and y-axis movement. The quantity of actuation beams and electrical flexures at each level (i.e., each concentric ring in this example) may be varied to achieve the desired level of stiffness and/or flexibility, and provide the required number of electrical connections.

Actuation beams 308, 310, 312 and/or electrical flexures 314 may include cantilevers and/or hinges (not shown) to enable movement in the out-of-plane (z-axis) direction. As discussed above, piezoelectric material may be used to achieve the desired deformation when an electrical signal is applied. The various beams (e.g., actuation beams 308, 310, 312) and electrical flexures (e.g., electrical flexure 314) may include a metal layer for routing electrical signals.

Center stage 300 may be divided into two or more discrete portions (e.g., center stage portions 300A, 300B), wherein the shape of these discrete portions may vary depending upon design criteria. Additionally, intermediate stages 304, 306 may also be divided into two or more discrete portions. In such a configuration and when an electrical signal is applied to the actuation beams connected to center stage portion 300A and/or center stage portion 300B, the portion of center stage 300 provided with the electrical signal may move out of plane (in the z-axis) to achieve a desired level of roll or pitch.

Figure 9A:
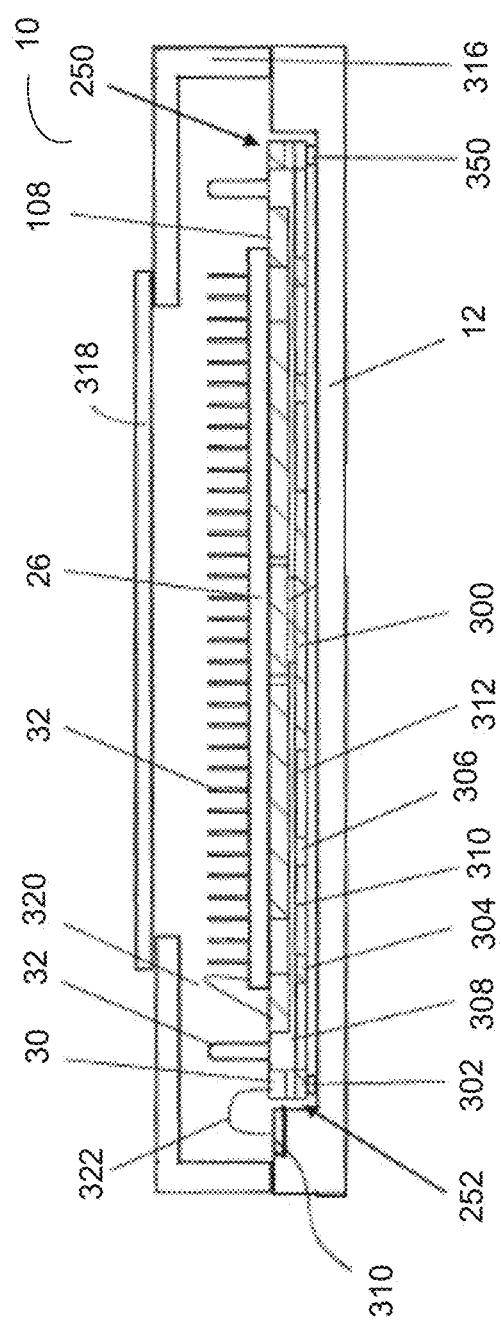
FIG. 9A is a cross-sectional view of a two-actuator package in accordance with various embodiments of the present disclosure.

Referring also to FIG. 9A, there is shown a cross-sectional view of a two-actuator package in accordance with various embodiments of the present disclosure. Out-of-plane actuator 252 may be joined to printed circuit board 12 at outer frame 302 by epoxy 350 or other suitable adhesive/material. Printed circuit board 12 may form part of package 10 in various embodiments. In-plane MEMS actuator 250 may be disposed on out-of-plane actuator 252 and may be bonded to outer frame 302 and center stage 300 of out-of-plane actuator 252. Optoelectronic device 26 may be disposed on top of in-plane MEMS actuator 250.

Holder assembly 316 (which may include glass window 318) may be disposed on top of printed circuit board 12 or in-plane MEMS actuator 250. Electrical connections 320 from optoelectronic device 26 to the outer periphery of MEMS in-plane actuator 250 may be achieved by e.g., a standard COB wire bonding process, by a conductive epoxy/paste, by a MEMS bonding process, or by another suitable bonding means. Electrical connections 322 from outer frame 30 of in-plane MEMS actuator 250 to pads 310 of printed circuit board 12 may use the same bonding process as that used for electrical connections 306.

As is understood, some embodiments of package 10 may not include out-of-plane actuator 252. In such embodiments, in-plane MEMS actuator 250 may be mounted directly to printed circuit board 12 by epoxying or otherwise affixing the fixed frame portions (e.g., fixed frame 156) of the comb drive sectors (e.g., comb drive sector 106) and outer frame 30 of micro-electrical-mechanical system (MEMS) actuator 24 to printed circuit board 12.

Figure 9B:
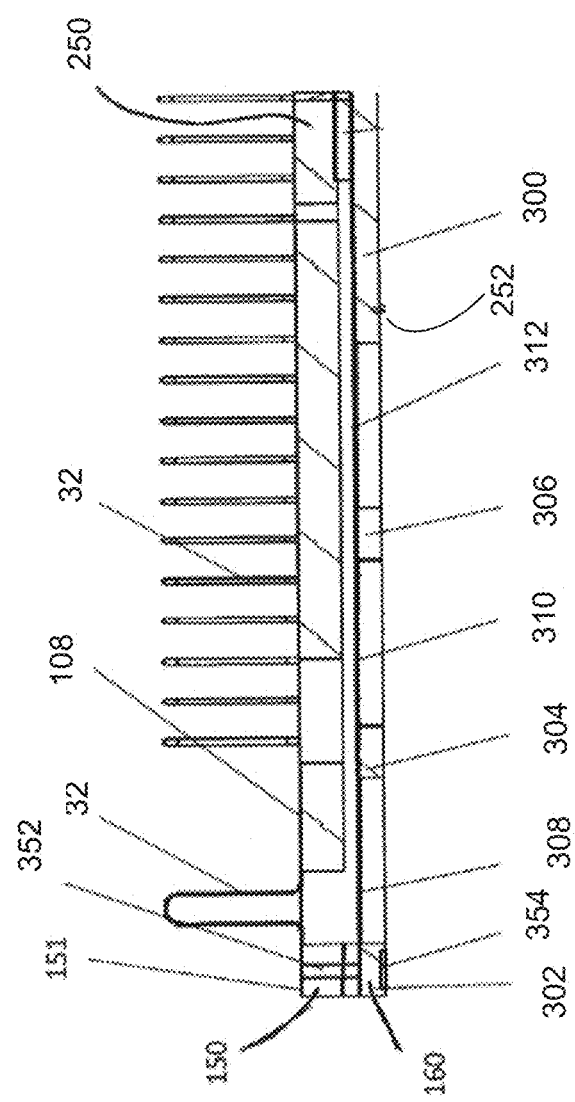
FIG. 9B is a cross-sectional detail view of a two-actuator package in accordance with various embodiments of the present disclosure.

Referring also to FIG. 9B, there is shown a cross-sectional detail view of a portion of the two-actuator package shown in FIG. 9A. For embodiments of package 10 that include out-of-plane actuator 252, out-of-plane actuator 252 may be electrically coupled to components outside of package 10 through conductive epoxy (or paste) disposed within passage 352 formed in in-plane MEMS actuator 250 and also through plurality of electrically conductive flexures 32 of in-plane MEMS actuator 250.

In various embodiments, the electrical routes/signals of out-of-plane actuator 252 may pass through electrical flexures 314 (see FIG. 8) or may pass through the actuation beam 308, 310, and 312 and through electrical contact 354 to be electrically coupled to circuit board 12 (not shown in FIG. 9B). Electrical signals may also pass through in-plane MEMS actuator 250 through passage 352 which may be filled with conductive epoxy, silver paste or an electrical plating to achieve the desired conduction.

Referring also to FIG. 10, there is shown a cross-sectional view of a portion of out-of-plane actuator 252 (in a deformed position) and in-plane MEMS actuator 250, in accordance with various embodiments of the present disclosure. Center stage 300 of "deformed" out-of-plane actuator 252 may be coupled to in-plane MEMS actuator 250, which is coupled to optoelectronic device 26. Electrical signals may be applied to actuation beams 308, 310, 312 and may result in the deformation of out-of-plane actuator 252. The flexibility of plurality of electrically conductive flexures 32 may be configured to enable three axis movement of in-plane MEMS actuator 250 while achieving the flexibility and robustness requirements of out-of-plane actuator 252.

Figure 11:
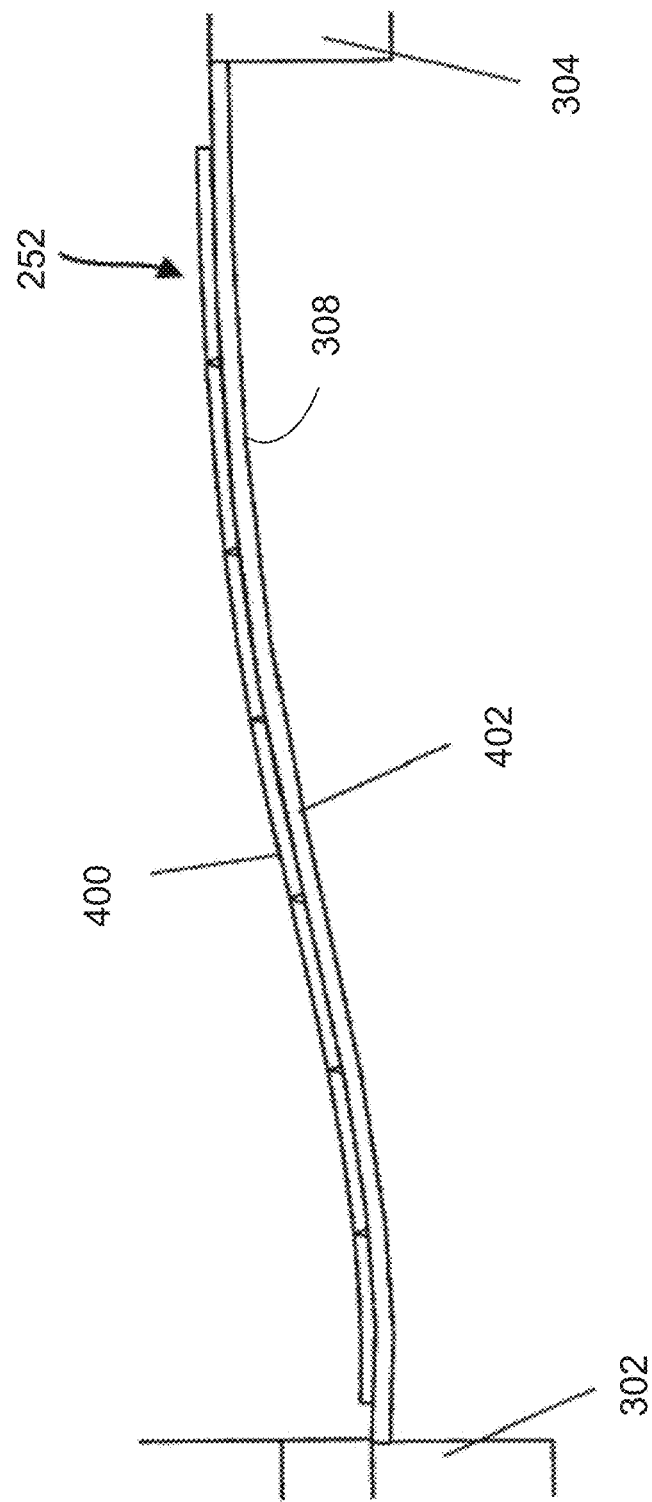
FIG. 11 is a cross-sectional view of an actuation beam of the deformed out-of-plane actuator of FIG. 10 in accordance with various embodiments of the present disclosure.

Z-axis "out-of-plane" movement of out-of-plane actuator 252 may be generated at least in part due to the deformation of actuation beams 308, 310, 312. As shown more clearly in FIG. 11, the actuation beam 308 may deform when an electrical signal is applied to the polarized piezoelectric material (e.g., PZT). Various suitable piezoelectric materials with different polarization pattern and characteristics may be used to achieve the desired level of deformation. While not shown, actuation beams 310, 312 (not shown) may deform similarly to actuation beam 308. In some embodiments, actuation beam 308 may be a composite material (e.g., including upper material 400 and lower material 402), wherein various materials may be used in combination to produce the desired piezoelectric effect. Further embodiments may utilize different configurations of in-plane MEMS actuator 250 and out-of-plane actuator 252 to achieve additional degrees of freedom.

MEMS Camera Package (Invention #3)

As discussed above, some embodiments of package 10 may not include out-of-plane actuator 252 and in such embodiments, in-plane MEMS actuator 250 may be mounted directly to printed circuit board 12 by epoxying or otherwise affixing the fixed frame portions (e.g., fixed frame 156) of the comb drive sectors (e.g., comb drive sector 106) and outer frame 30 of micro-electrical-mechanical system (MEMS) actuator 24 to printed circuit board 12. Accordingly, the following discussion concerns such a system (i.e., a camera package) that does not include an out-of-plane actuator.

Figure 12:
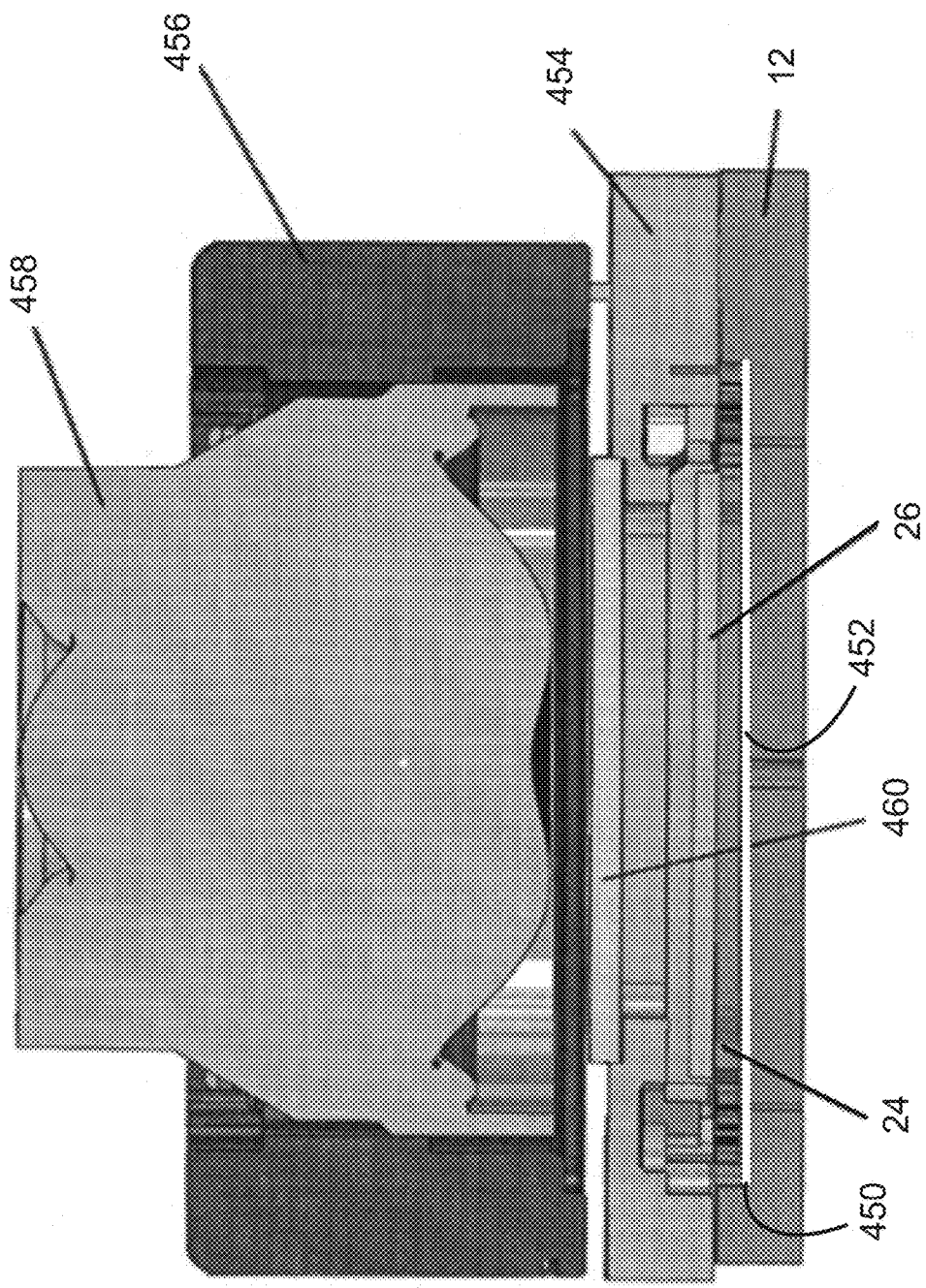
FIG. 12 is a cross-sectional view of a package including a single actuator in accordance with various embodiments of the present disclosure.

Referring also to FIG. 12, there is shown a cross-sectional view of a camera package (e.g., package 10) that does not include an out-of-plane actuator. Accordingly and for this example, package 10 is only capable of movement is two directions (e.g., x-axis and y-axis).

Package 10 may include micro-electrical-mechanical system (MEMS) actuator 24 that may be configured to be coupled (on a lower surface) to printed circuit board 12. Printed circuit board 12 may include recess 450 for receiving micro-electrical-mechanical system (MEMS) actuator 24. Printed circuit board 12 may include a metal plate 452 to effectuate the coupling of micro-electrical-mechanical system (MEMS) actuator 24 to printed circuit board 12. An example of metal plate 452 may include a stainless steel plate positioned within recess 450. Specifically, metal plate 452 may be epoxied/attached within recess 450 of printed circuit board 12 and may allow for the coupling of micro-electrical-mechanical system (MEMS) actuator 24 to a smooth, flat surface on printed circuit board 12.

An image sensor assembly (e.g., optoelectronic device 26) may be coupled to an upper surface of micro-electrical-mechanical system (MEMS) actuator 24. For example, optoelectronic device 26 may be epoxied/attached to outer periphery 110 of MEMS actuation core 34. Accordingly, by coupling optoelectronic device 26 to micro-electrical-mechanical system (MEMS) actuator 24, optoelectronic device 26 may be moved along the x-axis and the y-axis to effectuate various operations (e.g., image stabilization).

A holder assembly (e.g., holder assembly 454) may be coupled to and positioned with respect to micro-electrical-mechanical system (MEMS) actuator 24, wherein the purpose of holder assembly 454 may be to cover and snub micro-electrical-mechanical system (MEMS) actuator 24. For example and instead of positioning holder assembly 454 with respect to printed circuit board 12, holder assembly 454 may be positioned with respect to micro-electrical-mechanical system (MEMS) actuator 24. Accordingly and by positioning holder assembly 454 with respect to micro-electrical-mechanical system (MEMS) actuator 24, any irregularities associated with printed circuit board 12 may be eliminated.

Autofocus actuator 456 may be coupled to holder assembly 454 and lens assembly 458 may be coupled to autofocus actuator 456. IR filter 460 may be positioned between autofocus actuator 456 and holder assembly 454 and may be configured to filter infrared light from the incoming image before it strikes optoelectronic device 26.

Figure 13A:
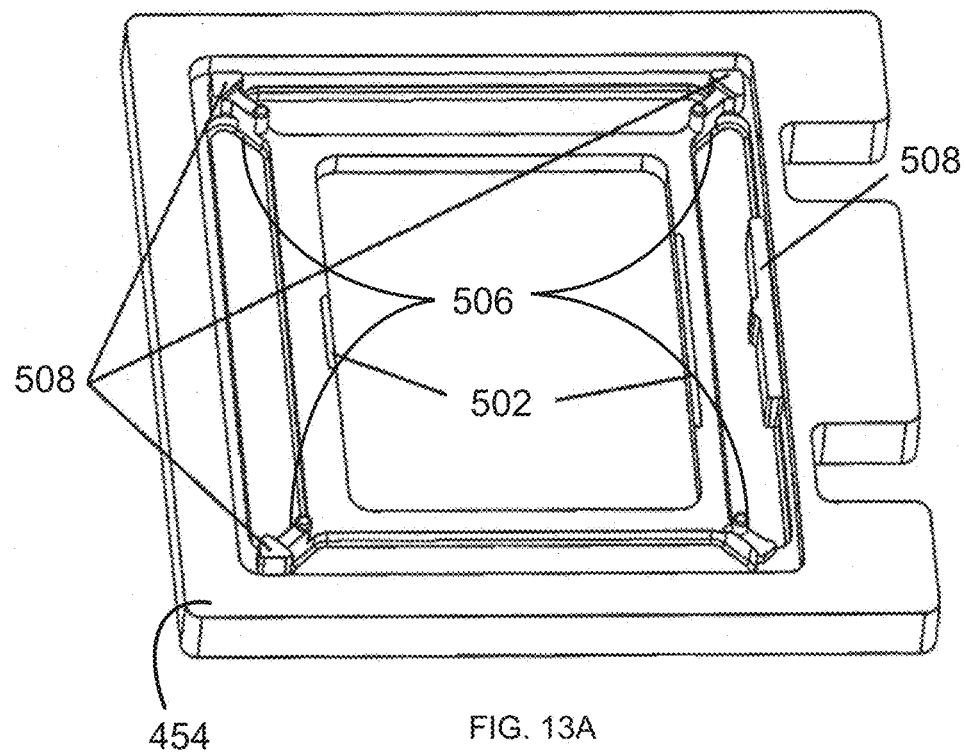
FIGS. 13A-13B are perspective view of a holder assembly in accordance with various embodiments of the present disclosure.
Figure 13B:
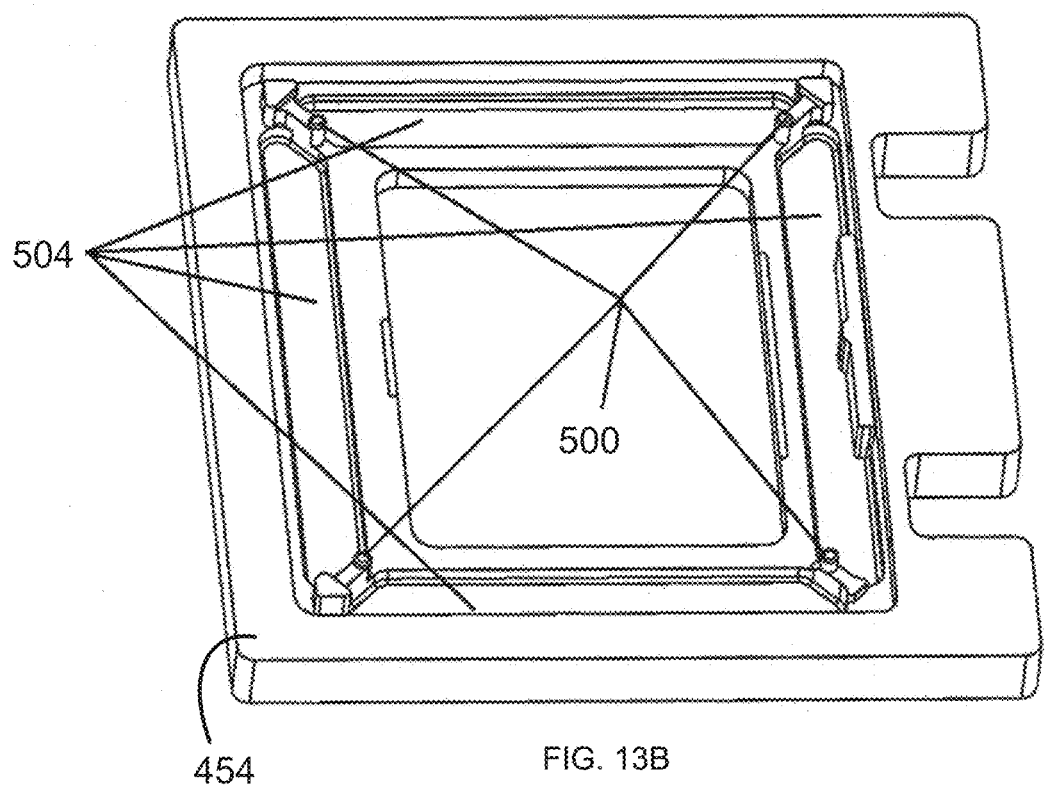

Referring also to FIGS. 13A-13B, holder assembly 454 may include one or more shock impact assemblies (e.g., shock impact assemblies 500) configured to define a maximum amount of z-axis movement for micro-electrical-mechanical system (MEMS) actuator 24 in response to an impact. Specifically, shock impact assemblies 500 may be positioned proximate moveable portions of micro-electrical-mechanical system (MEMS) actuator 24 (e.g., moveable frame 152 and moveable spines 154) so that z-axis movement of these moveable portions may be controlled. For example, the maximum amount of z-axis movement for the moveable portions (e.g., moveable frame 152 and moveable spines 154) of micro-electrical-mechanical system (MEMS) actuator 24 may be approximately 35 micrometers. Further, holder assembly 454 may include one or more image sensor stop assemblies (e.g., sensor stop assemblies 502) configured to snub optoelectronic device 26 and define a maximum amount of z-axis movement for optoelectronic device 26 in response to an impact. For example, the maximum amount of z-axis movement for optoelectronic device 26 may be approximately 40 micrometers. Specifically, the gap between holder assembly 454 and the image sensor assembly (e.g., optoelectronic device 26) may be approximately 195 micrometers, wherein the wire-bonding and epoxy may reduce this gap to approximately 40 micrometers.

Additionally, holder assembly 454 may include one or more clearance troughs (e.g., clearance troughs 504) configured to provide clearance for one or more electrical connectors (e.g., plurality of electrically conductive flexures 32) of micro-electrical-mechanical system (MEMS) actuator 24. Holder assembly 454 may further include one or more strengthening ribs (e.g., strengthening ribs 506) configured to span the one or more clearance troughs (e.g., clearance troughs 504) and stiffen holder assembly 454. Holder assembly 454 may also include one or more spacer assemblies (e.g., spacer assemblies 508) configured to position holder assembly 454 with respect to micro-electrical-mechanical system (MEMS) actuator 24. Specifically, spacer assemblies 508 may make contact with outer frame 30 of micro-electrical-mechanical system (MEMS) actuator 24.

Two-Axis MEMS Camera Package Assembly
(Invention #4)

As discussed above, some embodiments of package 10 may not include out-of-plane actuator 252 and the following discussion concerns such a system (i.e., a camera package) that does not include an out-of-plane actuator.

Figure 14:
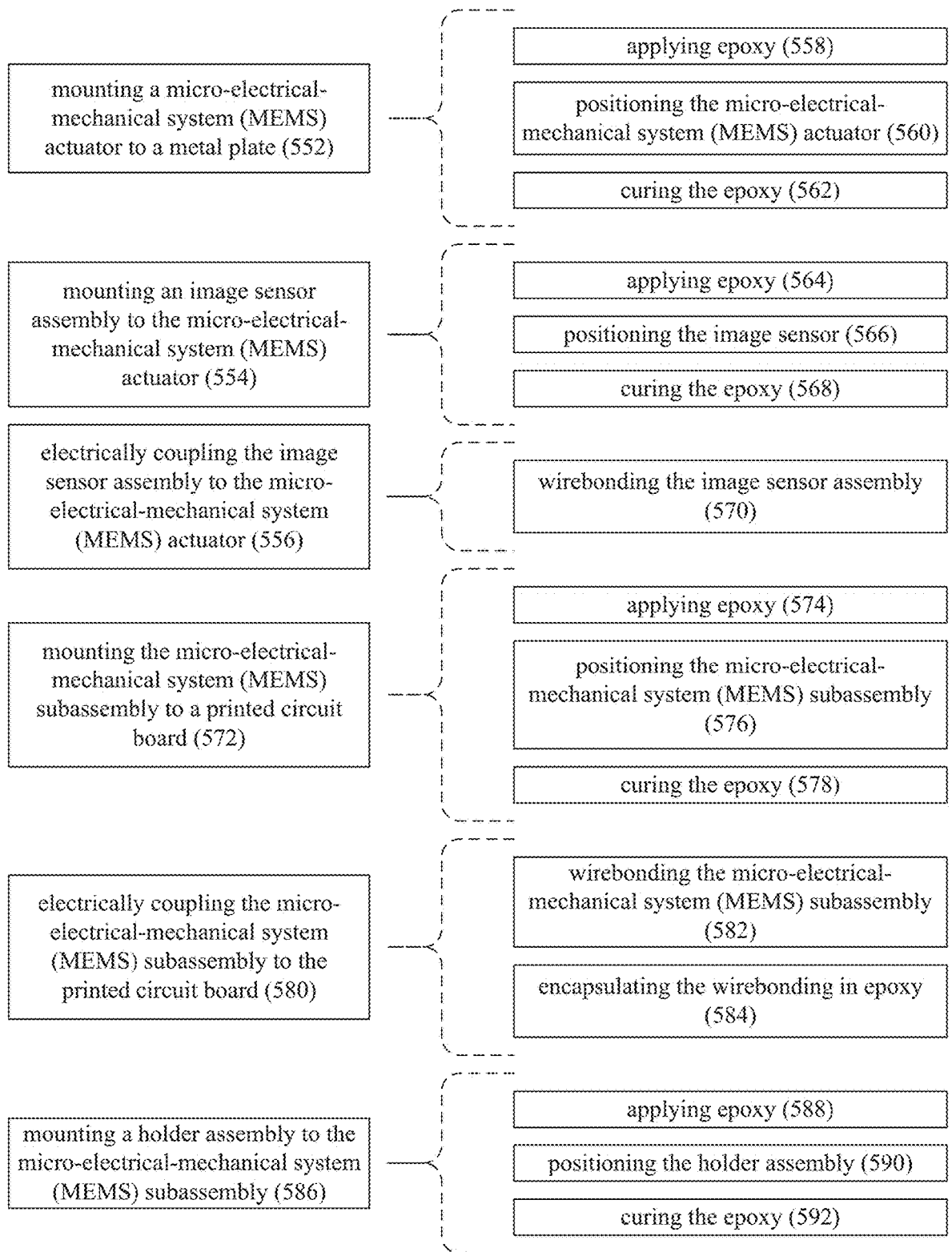
FIG. 14 is a flowchart of a method of assembling a package including a single actuator in accordance with various embodiments of the present disclosure.

Referring also to FIG. 14, method 550 of manufacturing a micro-electrical-mechanical system (MEMS) assembly may include mounting 552 micro-electrical-mechanical system (MEMS) actuator 24 to metal plate 452. An image sensor assembly (e.g., optoelectronic device 26) may be mounted 554 to micro-electrical-mechanical system (MEMS) actuator 24. The image sensor assembly (e.g., optoelectronic device 26) may be electrically coupled 556 to micro-electrical-mechanical system (MEMS) actuator 24, thus forming a micro-electrical-mechanical system (MEMS) subassembly.

Mounting 552 micro-electrical-mechanical system (MEMS) actuator 24 to metal plate 452 may include applying 558 epoxy to metal plate 452, positioning 560 micro-electrical-mechanical system (MEMS) actuator 24 on the epoxy, and curing 562 the epoxy. In other embodiments, other suitable glues or other adhesives may be used.

Mounting 554 an image sensor assembly (e.g., optoelectronic device 26) to micro-electrical-mechanical system (MEMS) actuator 24 may include applying 564 epoxy to micro-electrical-mechanical system (MEMS) actuator 24, positioning 566 the image sensor (e.g., optoelectronic device 26) on the epoxy, and curing 568 the epoxy. In other embodiments, other suitable glues or other adhesives may be used.

Electrically coupling 556 the image sensor assembly (e.g., optoelectronic device 26) to the micro-electrical-mechanical system (MEMS) actuator may include wire bonding 570 the image sensor assembly (e.g., optoelectronic device 26) to micro-electrical-mechanical system (MEMS) actuator 24.

The micro-electrical-mechanical system (MEMS) subassembly may be mounted 572 to printed circuit board 12. Mounting 572 the micro-electrical-mechanical system (MEMS) subassembly to printed circuit board 12 may include applying 574 epoxy to printed circuit board 12, positioning 576 the micro-electrical-mechanical system (MEMS) subassembly on the epoxy, and curing 578 the epoxy. In other embodiments, other suitable glues or other adhesives may be used. Printed circuit board 12 may include an opening (or a recess) to various depths and (in some embodiments) the epoxy may be applied to an upper surface of printed circuit board 12.

The micro-electrical-mechanical system (MEMS) subassembly may be electrically coupled 580 to printed circuit board 12. Electrically coupling 580 the micro-electrical-mechanical system (MEMS) subassembly to printed circuit board 12 may include wire bonding 582 the micro-electrical-mechanical system (MEMS) subassembly to printed circuit board 12. Electrically coupling 580 the micro-electrical-mechanical system (MEMS) subassembly to printed circuit board 12 may further include encapsulating 584 the wire bonding in epoxy.

Holder assembly 454 may be mounted 586 to the micro-electrical-mechanical system (MEMS) subassembly. Mounting 586 holder assembly 454 to the micro-electrical-mechanical system (MEMS) subassembly may include applying 588 epoxy to printed circuit board 12, positioning 590 the holder assembly on the epoxy, and curing 592 the epoxy. For example, holder assembly 454 may be placed on top of the micro-electrical-mechanical system (MEMS) subassembly and epoxy may be applied between holder assembly 454 and printed circuit board 12 (to couple holder assembly 454 to the micro-electrical-mechanical system (MEMS) subassembly). This epoxy may be applied in the gap between printed circuit board 12 and holder assembly 454 once holder assembly 454 is positioned on top of the micro-electrical-mechanical system (MEMS) subassembly. The spacer assemblies 508 may be used as a reference surface to make contact with the micro-electrical-mechanical system (MEMS) subassembly. In other embodiments, other suitable glues or other adhesives may be used.

Three-Axis MEMS Camera Package Assembly

As discussed above, some embodiments of package 10 may include out-of-plane actuator 252 and the following discussion concerns such a system (i.e., a camera package) that includes an out-of-plane actuator.

Figure 15:
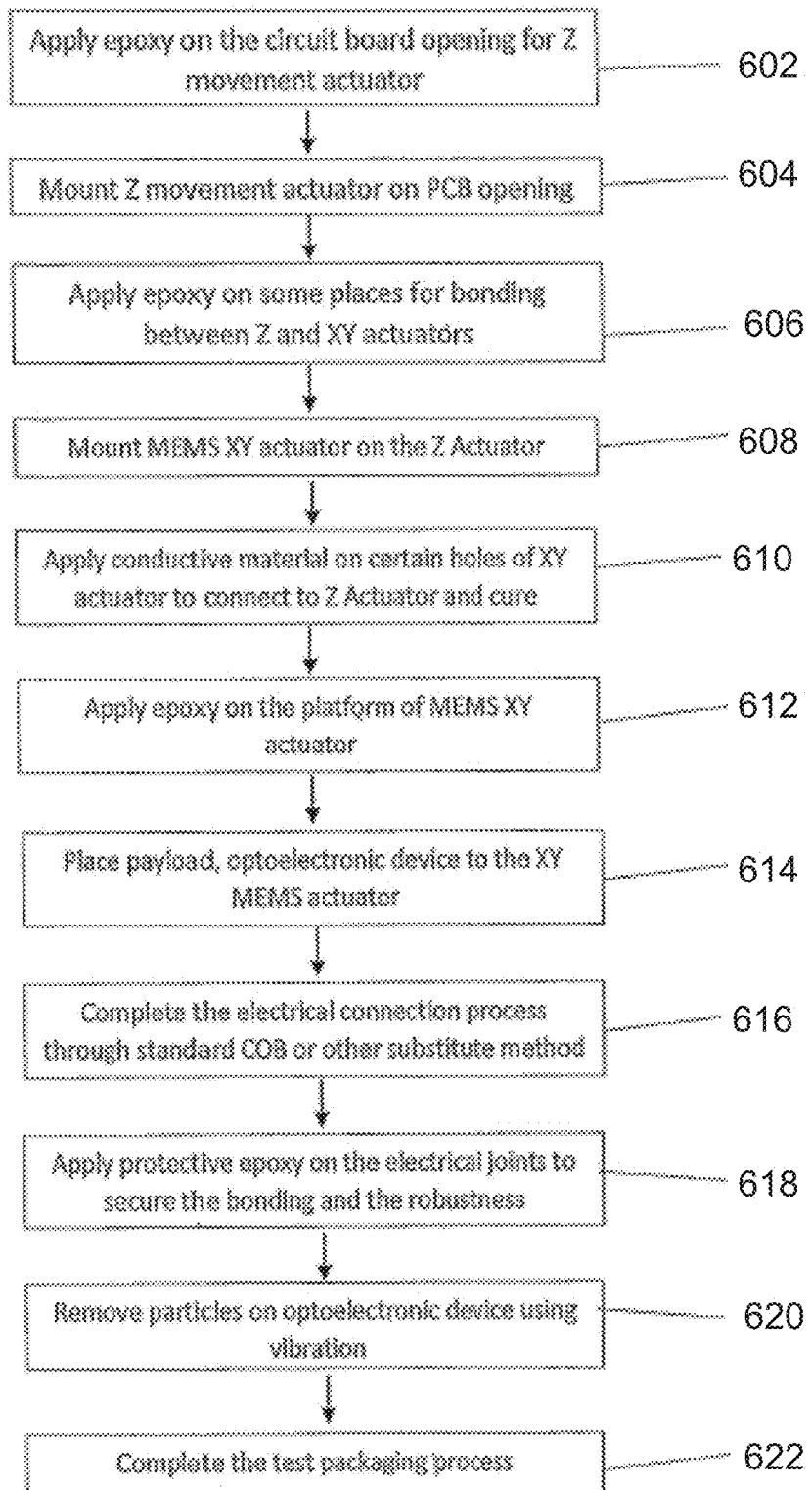
FIG. 15 is a flowchart of a method of assembling a package including multiple actuators in accordance with various embodiments of the present disclosure.

Referring also to FIG. 15, method 600 of manufacturing a micro-electrical-mechanical system (MEMS) assembly may include applying 602 epoxy on printed circuit board 12 for bonding outer frame 302 of out-of-plane actuator 252 to printed circuit board 12. In other embodiments, other suitable glues or other adhesives may be used. Printed circuit board 12 may include an opening (or a recess) to various depths and (in some embodiments) the epoxy may be applied to an upper surface of printed circuit board 12.

Out-of-plane actuator 252 may be a z-axis piezoelectric actuator and may be mounted 604 (directly or indirectly) on printed circuit board 12. In other embodiments, there may be another component disposed between out-of-plane actuator 252 and printed circuit board 12. After the epoxy is cured, outer frame 302 of out-of-plane actuator 252 may be applied to printed circuit board 12. Outer frame 302 of out-of-plane actuator 252 may be constructed of a silicon material (which may have a thermal expansion coefficient that matches printed circuit board 12). Additionally/alternatively, outer frame 302 may be constructed of a flexural material that compensates for any mismatch in thermal expansion.

After the assembly of out-of-plane actuator 252, epoxy may be applied 606 on center stage 300 and outer frame 302 of out-of-plane actuator 252. In other embodiments, other suitable glues or other adhesives may be used. In-plane MEMS actuator 250 may be placed 608 on out-of-plane actuator 252 and the epoxy may be allowed to cure. After curing, in-plane MEMS actuator 250 may be bonded to out-of-plane actuator 252 on printed circuit board 12.

Out-of-plane actuator 252 may include conductive traces that pass through in-plane MEMS actuator 250 (as described above). Conductive epoxy or similar material may be provided 610 on associated holes on in-plane MEMS actuator 250 to connect and electrically couple to out-of-plane actuator 252, wherein the conductive epoxy is subsequently allowed to cure.

Thermal epoxy (or another suitable adhesive) may be applied 612 on an outer periphery of in-plane MEMS actuator 250, and then optoelectronic device 26 may be joined 614 to in-plane MEMS actuator 250. Various suitable epoxies or other adhesives may be used.

After curing to affix optoelectronic device 26 to in-plane MEMS actuator 250, electrical connections through standard COB process (or other suitable methods) may be completed 616. Protective epoxy may be applied 618 to the electrical joints to enhance the strength and robustness of the bond. Other protective materials may be used in other embodiments.

If there are particles on optoelectronic device 26, these particles may be removed by vibrating 620 optoelectronic device 154, wherein holder 302 (which may include glass window 304) may be mounted 622 onto circuit board 12 or in-plane MEMS actuator 250.

Zipper Actuator (Invention #5)

The above discussion concerned the use of e.g., micro-electrical-mechanical system (MEMS) actuator 24 that includes a plurality of actuation fingers, which includes moveable actuation fingers 162B (coupled to moveable frame 152 and moveable spine 154B) and fixed actuation fingers 164B (coupled to fixed frame 156 and fixed spines 158). While the use of such a finger-based MEMS actuator provides a high level of granularity and controllability, often times, such granularity and controllability is not needed. For example, certain systems only require that a system be in one of two states (e.g., on/off, open/closed, up/down). Examples of such a system may include but are not limited to a shutter control system (i.e., the shutter is either opened or closed) and a telephoto lens system (i.e., the lens is either in standard mode or zoom mode).

Figure 16:
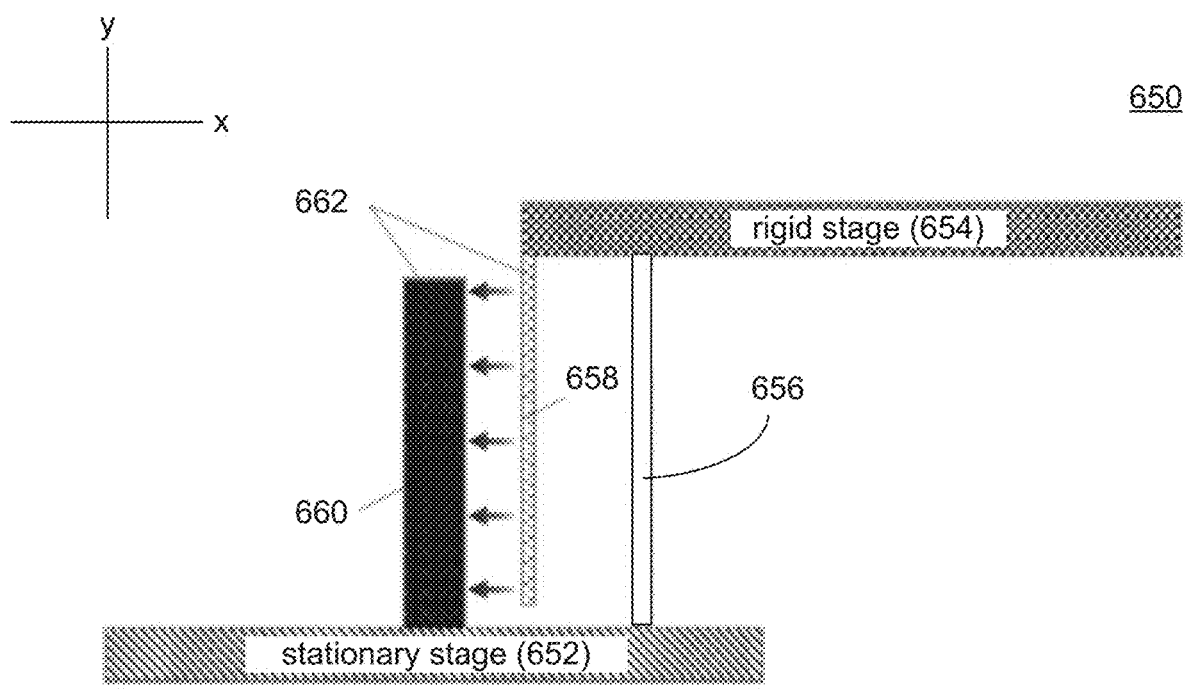
FIG. 16 is a diagrammatic view of a zipper actuator in accordance with various embodiments of the present disclosure.

In such situations, a zipper actuator may be used, as zipper actuators provide good performance with systems that require only two such positions. Referring also to FIG. 16, micro-electrical-mechanical system (MEMS) assembly 650 may include stationary stage 652 and rigid stage 654. At least one flexure 656 may be configured to slidably couple stationary stage 652 and rigid stage 654, thus allowing rigid stage 654 to be slidably displaced along the x-axis. At least one flexible electrode 658 is coupled to and essentially orthogonal to one of stationary stage 652 and rigid stage 654. And at least one rigid electrode 660 is coupled to and essentially orthogonal to the other of stationary stage 652 and rigid stage 654.

The at least one flexible electrode 658 may be configured to be energized at a first voltage potential and the at least one rigid electrode 660 may be configured to be energized at a second voltage potential. Accordingly and by applying a voltage potential across electrodes 658, 660, an electric field may be generated between electrodes 658, 660 that will draw electrodes 658, 660 towards each other. Specifically and in the embodiment shown in FIG. 16, flexible electrode 658 will be drawn towards rigid electrode 660. And as flexible electrode 658 is flexible, flexible electrode 658 will bend toward rigid electrode 660 until the point at which the lower end of flexible electrode 658 contacts the lower end of rigid electrode 660. At this point, flexure 656 may flex and allow rigid stage 654 to move toward rigid electrode 660, allowing the entirety of flexible electrode 658 to "zipper up" against rigid electrode 660 and close any gap therebetween. Electrodes 658, 660 may each include insulation layer 662 so that when electrodes 658, 660 initially contact each other, they do not short out. This, in turn, will allow the above-described voltage potential to be maintained and allow flexible electrode 658 to fully engage rigid electrode 660.

As discussed above, micro-electrical-mechanical system (MEMS) assembly 650 may include at least one flexible electrode 658 and at least one rigid electrode 660. Accordingly, micro-electrical-mechanical system (MEMS) assembly 650 may include two or more flexible electrodes (that are coupled and essentially orthogonal to one of the stationary stage and the rigid stage) and two or more rigid electrodes (that are coupled and essentially orthogonal to the other of the stationary stage and the rigid stage). For example, FIG. 17A shows an embodiment of micro-electrical-mechanical system (MEMS) assembly 650 that includes two rigid electrodes (e.g., rigid electrodes 700, 702) and two flexible electrode (e.g., flexible electrodes 704, 706).

Figure 17A:
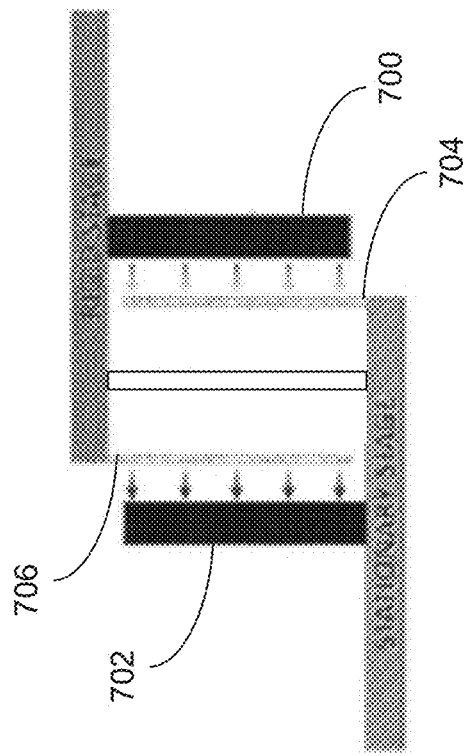
FIGS. 17A-17C are diagrammatic views of alternative embodiments of the zipper actuator of FIG. 16 in accordance with various embodiments of the present disclosure.
Figure 17B:
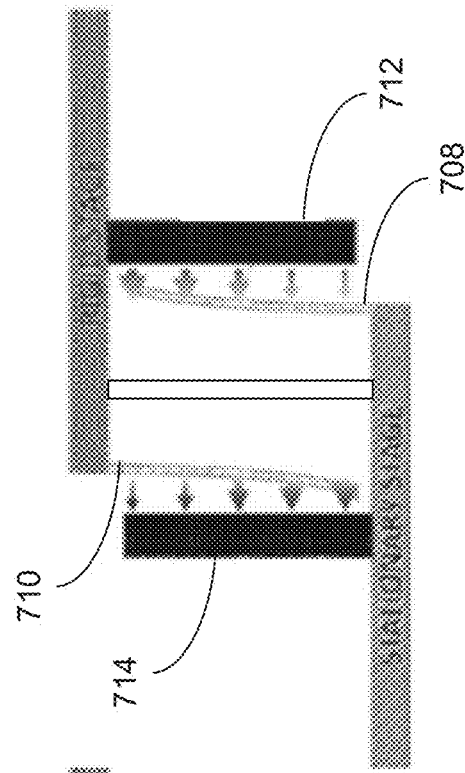

Typically, the flexible electrodes (e.g., flexible electrodes 658, 704, 706) may be generally straight in shape (as shown in FIGS. 16, 17A). However and as shown in FIG. 17B, these flexible electrodes may be generally curved in shape (e.g., flexible electrodes 708, 710) and may be curved toward rigid electrodes 712, 714.

Figure 17C:
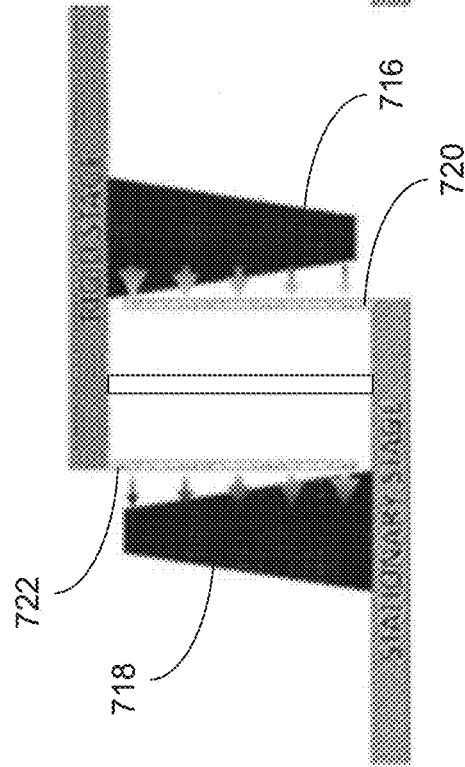

Additionally/alternatively, while the rigid electrodes (e.g., 660, 700, 702, 712, 714) are shown to be generally rectangular in shape, this is for illustrative purposes only and is not intended to be a limitation of this disclosure, as other configurations are possible. For example and as shown in FIG. 17C, these rigid electrode (e.g., rigid electrodes 716, 718) may include at least one surface that is not orthogonal to the stationary stage and/or the rigid stage. For example, rigid electrodes 716, 718 are shown to be somewhat pyramidal in shape, where the portion proximate the stage to which it is attached in comparatively wider and is angled toward flexible electrodes 720, 722.

Figure 18A:
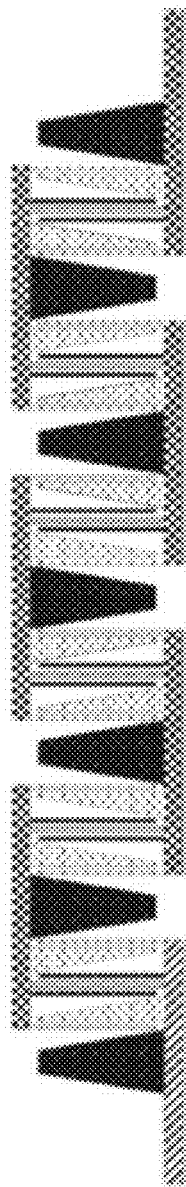
FIGS. 18A-18B are diagrammatic views of alternative embodiments of the zipper actuator of FIG. 16 in accordance with various embodiments of the present disclosure.
Figure 18B:
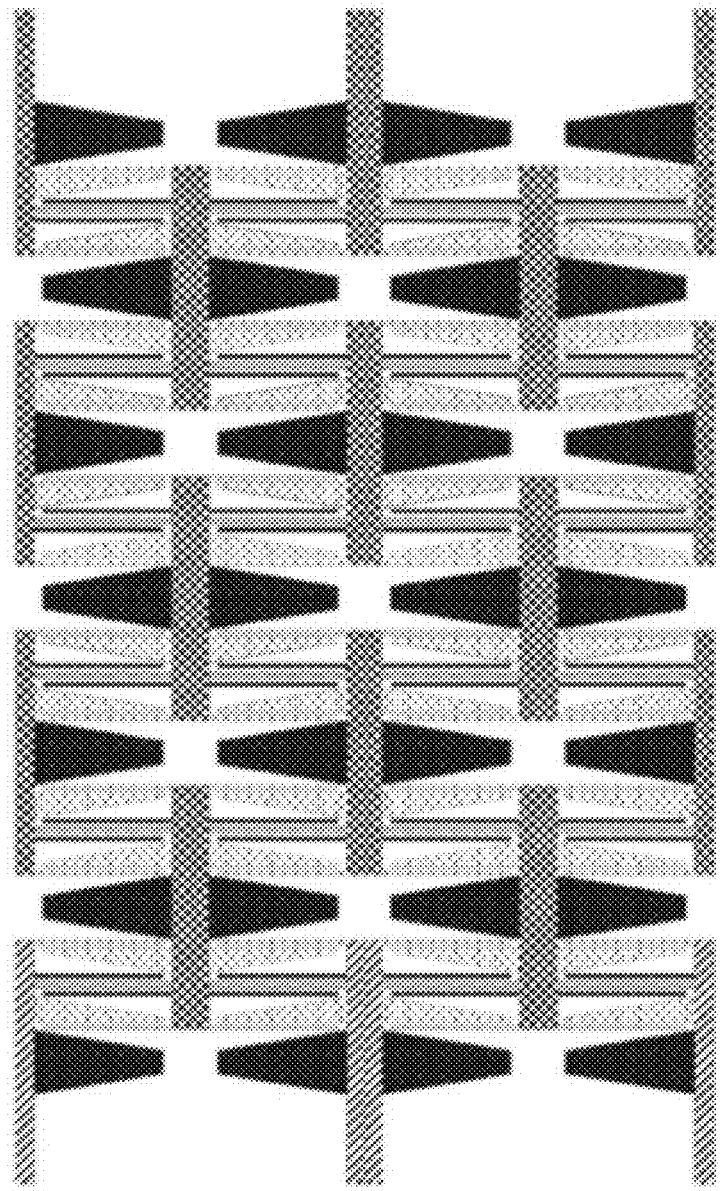

In order to enhance the utility of micro-electrical-mechanical system (MEMS) assembly 650, micro-electrical-mechanical system (MEMS) assembly 650 may include a plurality of assemblies that may be arranged in a series configuration (as shown in FIG. 18A) to enhances the maximum placement of the rigid (i.e., moveable) stages. Additionally, micro-electrical-mechanical system (MEMS) assembly 650 may include a plurality of assemblies that may be arranged in a parallel configuration to enhance the strength/power of the rigid (i.e., moveable) stages and/or in a parallel-series configuration (as shown in FIG. 18B) to enhances both the maximum displacement and the strength/power of the rigid (i.e., moveable) stages.

Slidable Connection Assemblies (Invention #7)

As is known in the art, various etching processes may be utilized when manufacturing MEMS devices (e.g., micro-electrical-mechanical system (MEMS) actuator 24), wherein dozens of these MEMS devices may be etched into a single silicon wafer. Automated machinery and assembly robots may be utilized to retrieve these MEMS devices from the wafer and perform the above-described assembly processes. Accordingly, it may be desirable to include some form of structure on the wafer that holds these MEMS devices in their appropriate positions on the wafer until they are needed for assembly, at which point, this structure should allow for the easy removal of these MEMS devices from the wafer.

Figure 19A:
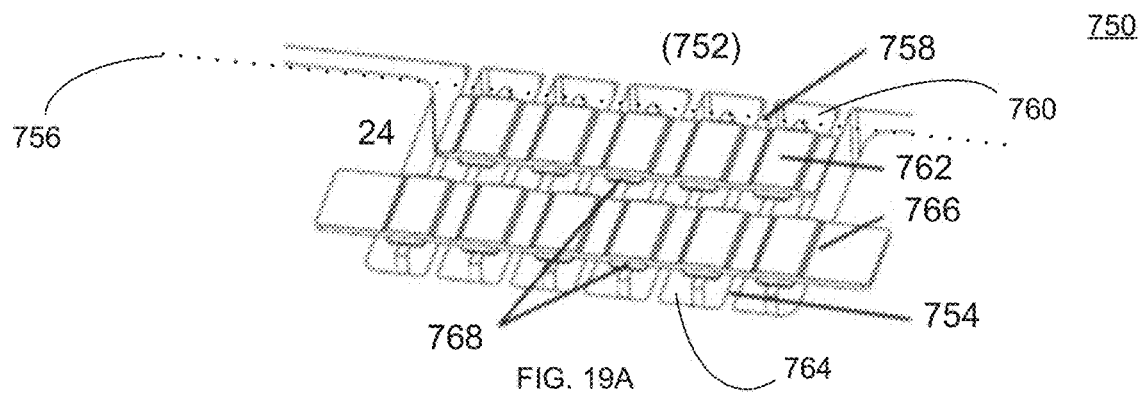
FIGS. 19A-19C are diagrammatic views of slidable connection assemblies in accordance with various embodiments of the present disclosure.
Figure 19B:
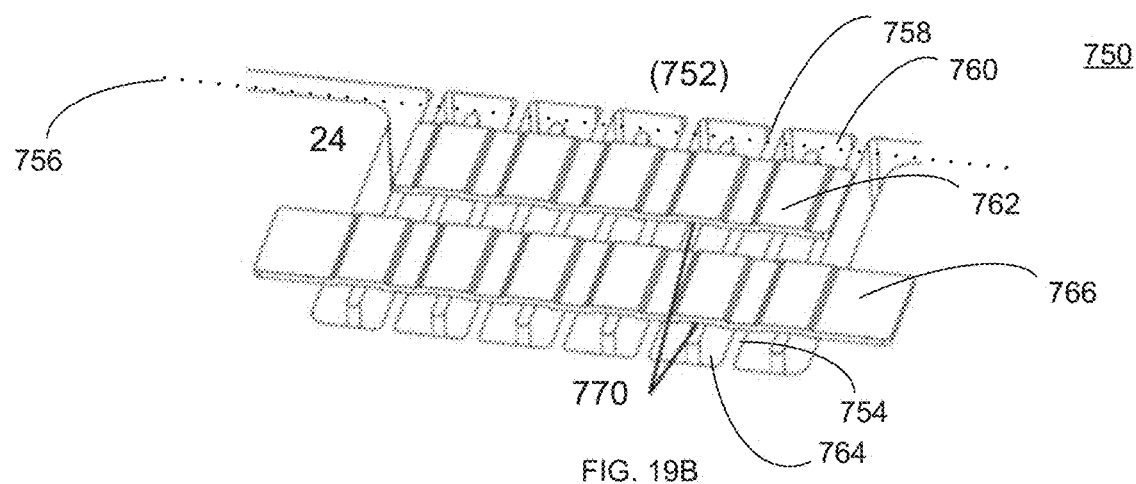
Figure 19C:
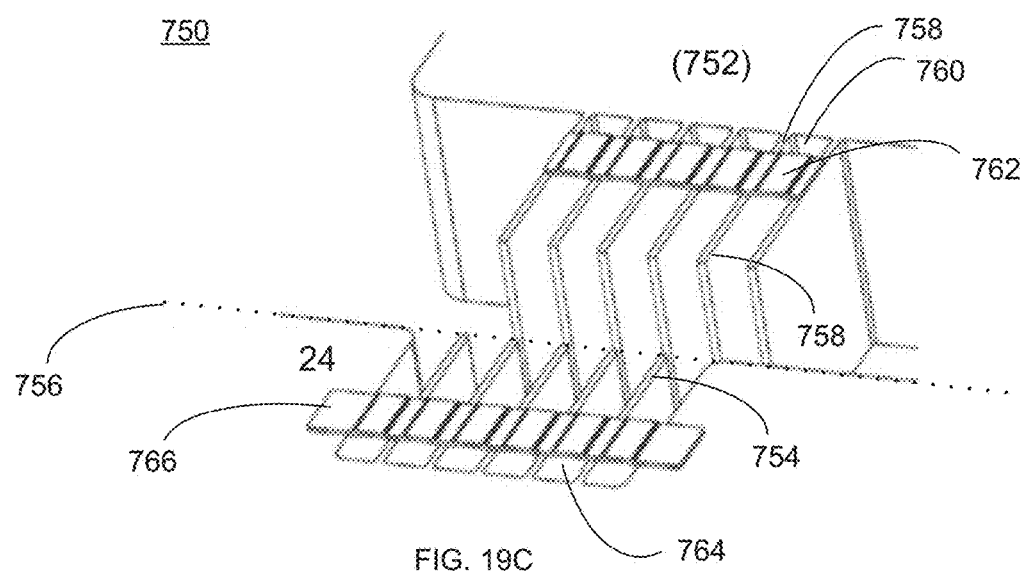

Referring also to FIGS. 19A-19C, there is shown one implementation of a slidable connection assembly that may be used to temporarily hold a MEMS device in the appropriate position on a wafer until the MEMS device is needed for e.g., assembly. Accordingly, the micro-electrical-mechanical system (MEMS) device (e.g., micro-electrical-mechanical system (MEMS) actuator 24) may include one or more slidable connection assemblies (e.g., slidable connection assemblies 750) for releasably coupling the micro-electrical-mechanical system (MEMS) device to the wafer (e.g., wafer 752) from which the micro-electrical-mechanical system (MEMS) device was made. Specifically, the slidable connection assemblies (e.g., slidable connection assemblies 750) may be manufactured at the same time as the micro-electrical-mechanical system (MEMS) device (e.g., micro-electrical-mechanical system (MEMS) actuator 24) and may be made from the same wafer (e.g., wafer 752) that the micro-electrical-mechanical system (MEMS) device (e.g., micro-electrical-mechanical system (MEMS) actuator 24) is made from. Accordingly, the one or more slidable connection assemblies (e.g., slidable connection assemblies 750) may include a portion of wafer 752 (e.g., a supporting pillar on wafer 752).

As discussed above, micro-electrical-mechanical system (MEMS) actuator 24 may include MEMS actuation core 34 and a MEMS electrical connector assembly (e.g., outer frame 30) electrically coupled to MEMS actuation core 34 and configured to be electrically coupled to a printed circuit board (e.g., printed circuit board 12).

The one or more slidable connection assemblies (e.g., slidable connection assemblies 750) may be any portion of the MEMS device that is being positioned by slidable connection assemblies 750. For example, slidable connection assemblies 750 may be a portion of MEMS actuation core 34 and/or a portion of the MEMS electrical connector (e.g., outer frame 30).

The one or more slidable connection assemblies (e.g., slidable connection assemblies 750) may be configured to allow for the easy removal of the micro-electrical-mechanical system (MEMS) device (e.g., micro-electrical-mechanical system (MEMS) actuator 24) from wafer 752 when needed for assembly but (up to that point) securely position the micro-electrical-mechanical system (MEMS) device (e.g., micro-electrical-mechanical system (MEMS) actuator 24) on wafer 752.

Accordingly, the one or more slidable connection assemblies (e.g., slidable connection assemblies 750) may include one or more finger assemblies (e.g., device finger assemblies 754) on the micro-electrical-mechanical system (MEMS) device (e.g., micro-electrical-mechanical system (MEMS) actuator 24). Device finger assemblies 754 may be sized so that they do not extend past the appropriate edge (e.g., edge 756) of e.g., micro-electrical-mechanical system (MEMS) actuator 24, thus allowing micro-electrical-mechanical system (MEMS) actuator 24 to tightly abut or lay flat upon another device/system.

The one or more slidable connection assemblies (e.g., slidable connection assemblies 750) may also include one or more finger assemblies (e.g., wafer finger assemblies 758) on wafer 752. The one or more slidable connection assemblies (e.g., slidable connection assemblies 750) may also include one or more socket assemblies (e.g., wafer socket assemblies 760) on wafer 752 that are configured to receive the one or more finger assemblies (e.g., device finger assemblies 754) on the micro-electrical-mechanical system (MEMS) device (e.g., micro-electrical-mechanical system (MEMS) actuator 24).

The one or more socket assemblies (e.g., wafer socket assemblies 760) on wafer 752 may include a spanning structure (e.g., wafer spanning structure 762) configured to span at least two fingers (chosen from wafer finger assemblies 758) on wafer 752, thus forming the one or more socket assemblies (e.g., wafer socket assemblies 760) therebetween.

The one or more slidable connection assemblies (e.g., slidable connection assemblies 750) may also include one or more socket assemblies (e.g., device socket assemblies 764) on the micro-electrical-mechanical system (MEMS) device (e.g., micro-electrical-mechanical system (MEMS) actuator 24) that are configured to receive the one or more finger assemblies (e.g., wafer finger assemblies 758) on wafer 752.

The one or more socket assemblies (e.g., device socket assemblies 764) on the micro-electrical-mechanical system (MEMS) device (e.g., micro-electrical-mechanical system (MEMS) actuator 24) may include a spanning structure (e.g., device spanning structure 766) that is configured to span at least two fingers (chosen from device finger assemblies 754) of the micro-electrical-mechanical system (MEMS) device (e.g., micro-electrical-mechanical system (MEMS) actuator 24), thus forming the one or more socket assemblies (e.g., device socket assemblies 764) therebetween.

While manufacturing spanning structures 762, 766, patches of thin film may be deposited on top of overlapping areas of the fingers (e.g., device finger assemblies 754 and wafer finger assemblies 758). Specifically, a patch of thin film may be attached to span three fingers (e.g., for wafer spanning structure 762, one device finger assembly and two wafer finger assemblies), wherein the film is detached from (in this example) the one device finger assembly so that the device finger assembly may be removed from the appropriate wafer socket assembly 760. Sacrificial layers 768 may be constructed of poly silicon material and may be removed during the release process and may leave gap 770 that allows for the removal of the device finger assembly from the appropriate wafer socket assembly 760.

General

In general, the various operations of method described herein may be accomplished using or may pertain to components or features of the various systems and/or apparatus with their respective components and subcomponents, described herein.

The presence of broadening words and phrases such as "one or more," "at least," "but not limited to" or other like phrases in some instances shall not be read to mean that the narrower case is intended or required in instances where such broadening phrases may be absent.

Additionally, the various embodiments set forth herein are described in terms of example block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

While various embodiments of the present disclosure have been described above, it should be understood that they have been presented by way of example only, and not of limitation. Likewise, the various diagrams may depict an example architectural or other configuration for the disclosure, which is done to aid in understanding the features and functionality that can be included in the disclosure. The disclosure is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present disclosure. Additionally, with regard to flow diagrams, operational descriptions and method claims, the order in which the steps are presented herein shall not mandate that various embodiments be implemented to perform the recited functionality in the same order unless the context dictates otherwise.

Although the disclosure is described above in terms of various example embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosure, whether or not such embodiments are described and whether or not such features are presented as being a part of a described embodiment. Thus, the breadth and scope of the present disclosure should not be limited by any of the above-described example embodiments, and it will be understood by those skilled in the art that various changes and modifications to the previous descriptions may be made within the scope of the claims.

As will be appreciated by one skilled in the art, the present disclosure may be embodied as a method, a system, or a computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. The computer-usable or computer-readable medium may also be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to the Internet, wireline, optical fiber cable, RF, etc.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network/a wide area network/the Internet (e.g., network 18).

The present disclosure is described with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer/special purpose computer/other programmable data processing apparatus, such that the instructions, which execute via the processor of the computer or other programmable data processing apparatus, create means for implementing the functions/acts specified in the flowchart and/or block diagram block or blocks.

These computer program instructions may also be stored in a computer-readable memory that may direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The flowcharts and block diagrams in the figures may illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. A micro-electrical-mechanical system (MEMS) device comprising:
one or more slidable connection assemblies for releasably coupling the micro-electrical-mechanical system (MEMS) device to a wafer from which the micro-electrical-mechanical system (MEMS) device was made, wherein the one or more slidable connection assemblies includes one or more finger assemblies on the micro-electrical-mechanical system (MEMS) device and one or more socket assemblies on the wafer that are configured to receive the one or more finger assemblies.

2. The micro-electrical-mechanical system (MEMS) device of claim 1 wherein the one or more slidable connection assemblies includes a portion of the wafer.

3. The micro-electrical-mechanical system (MEMS) device of claim 2 wherein the portion of the wafer provides support on the wafer.

4. The micro-electrical-mechanical system (MEMS) device of claim 1 wherein the micro-electrical-mechanical system (MEMS) device includes:
 a MEMS actuation core; and
 a MEMS electrical connector assembly electrically coupled to the MEMS actuation core and configured to be electrically coupled to a printed circuit board.

5. The micro-electrical-mechanical system (MEMS) device of claim 4 wherein the one or more slidable connection assemblies includes a portion of the MEMS actuation core.

6. The micro-electrical-mechanical system (MEMS) device of claim 4 wherein the one or more slidable connection assemblies includes a portion of the MEMS electrical connector assembly.

7. The micro-electrical-mechanical system (MEMS) device of claim 1 wherein the one or more socket assemblies on the wafer includes:
 a spanning structure configured to span at least two fingers of the wafer, thus forming the one or more socket assemblies therebetween.

8. The micro-electrical-mechanical system (MEMS) device of claim 1 wherein the one or more slidable connection assemblies includes:
 one or more finger assemblies on the wafer.

9. The micro-electrical-mechanical system (MEMS) device of claim 8 wherein the one or more slidable connection assemblies includes:
 one or more socket assemblies on the micro-electrical-mechanical system (MEMS) device that are configured to receive the one or more finger assemblies.

10. The micro-electrical-mechanical system (MEMS) device of claim 9 wherein the one or more socket assemblies on the micro-electrical-mechanical system (MEMS) device includes:
 a spanning structure configured to span at least two fingers of the micro-electrical-mechanical system (MEMS) device, thus forming the one or more socket assemblies therebetween.

11. A micro-electrical-mechanical system (MEMS) device comprising:
 a MEMS actuation core;
 a MEMS electrical connector assembly electrically coupled to the MEMS actuation core and configured to be electrically coupled to a printed circuit board; and
 one or more slidable connection assemblies for releasably coupling the micro-electrical-mechanical system (MEMS) device to a wafer from which the micro-electrical-mechanical system (MEMS) device was made, wherein the one or more slidable connection assemblies includes one or more finger assemblies on the micro-electrical-mechanical system (MEMS) device and one or more socket assemblies on the wafer that are configured to receive the one or more finger assemblies.

12. The micro-electrical-mechanical system (MEMS) device of claim 11 wherein the one or more slidable connection assemblies includes a portion of the wafer.

13. The micro-electrical-mechanical system (MEMS) device of claim 12 wherein the portion of the wafer provides support on the wafer.

14. The micro-electrical-mechanical system (MEMS) device of claim 11 wherein the one or more slidable connection assemblies includes a portion of the MEMS actuation core.

15. The micro-electrical-mechanical system (MEMS) device of claim 11 wherein the one or more slidable connection assemblies includes a portion of the MEMS electrical connector assembly.

16. A micro-electrical-mechanical system (MEMS) device comprising:
 a MEMS actuation core;
 a MEMS electrical connector assembly electrically coupled to the MEMS actuation core and configured to be electrically coupled to a printed circuit board; and
 one or more slidable connection assemblies for releasably coupling the micro-electrical-mechanical system (MEMS) device to a wafer from which the micro-electrical-mechanical system (MEMS) device was made, wherein the one or more slidable connection assemblies includes one or more finger assemblies on the micro-electrical-mechanical system (MEMS) device and one or more socket assemblies on the wafer that are configured to receive the one or more finger assemblies.

17. The micro-electrical-mechanical system (MEMS) device of claim 16 wherein the one or more slidable connection assemblies includes:
 a spanning structure configured to span at least two fingers of the wafer, thus forming the one or more socket assemblies therebetween.

18. The micro-electrical-mechanical system (MEMS) device of claim 16 wherein the one or more slidable connection assemblies includes:
 one or more finger assemblies on the wafer; and
 one or more socket assemblies on the micro-electrical-mechanical system (MEMS) device that are configured to receive the one or more finger assemblies, including:
  a spanning structure configured to span at least two fingers of the micro-electrical-mechanical system (MEMS) device, thus forming the one or more socket assemblies therebetween.

* * * * *